(12) United States Patent
Che

(10) Patent No.: US 10,672,999 B2
(45) Date of Patent: Jun. 2, 2020

(54) GOLD COMPLEXES FOR OLED APPLICATIONS

(71) Applicant: THE UNIVERSITY OF HONG KONG, Hong Kong (HK)

(72) Inventor: Chi-Ming Che, Hong Kong (HK)

(73) Assignee: THE UNIVERSITY OF HONG KONG, Hong Kong (HK)

( * ) Notice: Subject to any disclaimer, the term of this patent is extended or adjusted under 35 U.S.C. 154(b) by 296 days.

(21) Appl. No.: 15/097,425

(22) Filed: Apr. 13, 2016

(65) Prior Publication Data

US 2016/0301020 A1    Oct. 13, 2016

Related U.S. Application Data

(60) Provisional application No. 62/146,636, filed on Apr. 13, 2015.

(51) Int. Cl.
| | |
|---|---|
| H01L 51/00 | (2006.01) |
| C09K 11/06 | (2006.01) |
| C07F 9/50 | (2006.01) |
| C07F 9/36 | (2006.01) |
| C07F 1/12 | (2006.01) |
| H01L 51/50 | (2006.01) |

(52) U.S. Cl.
CPC .......... *H01L 51/0091* (2013.01); *C07F 1/12* (2013.01); *C07F 9/36* (2013.01); *C07F 9/5045* (2013.01); *C09K 11/06* (2013.01); *C09K 2211/1007* (2013.01); *C09K 2211/1011* (2013.01); *C09K 2211/1029* (2013.01); *C09K 2211/188* (2013.01); *H01L 51/0037* (2013.01); *H01L 51/5016* (2013.01)

(58) Field of Classification Search
CPC ... H01L 51/0077–0092; H01L 51/0091; C07F 1/12
See application file for complete search history.

(56) References Cited

U.S. PATENT DOCUMENTS

| | | |
|---|---|---|
| 8,530,685 B1 | 9/2013 | Sista et al. |
| 2004/0219387 A1* | 11/2004 | Li .................. C07C 211/54 428/690 |
| 2006/0091378 A1 | 5/2006 | Yam et al. |
| 2006/0269779 A1 | 11/2006 | Takahashi et al. |
| 2007/0259208 A1 | 11/2007 | Kathirgamanathan et al. |
| 2008/0135806 A1* | 6/2008 | Ye .................. C07D 209/88 252/301.35 |
| 2008/0214818 A1 | 9/2008 | Chin et al. |
| 2009/0278453 A1 | 11/2009 | Yam et al. |
| 2011/0012093 A1 | 1/2011 | Yam et al. |

(Continued)

FOREIGN PATENT DOCUMENTS

JP    2006083353 A  *  3/2006

OTHER PUBLICATIONS

Bronner, et al. "Luminescent cyclometalated gold (III) complexes." Dalton Transactions 40.46 (2011): 12409-12420.*

(Continued)

*Primary Examiner* — William E McClain
(74) *Attorney, Agent, or Firm* — Amin, Turocy & Watson, LLP

(57) ABSTRACT

Gold(III) emitters showing high emission quantum efficiency and stable in thermal deposition process are described. High performance OLEDs can be fabricated from these emitters.

7 Claims, 7 Drawing Sheets

Ligand 300

Intermedate 410

Intermedate 420

Emitter 100

(56) References Cited

U.S. PATENT DOCUMENTS

| | | | |
|---|---|---|---|
| 2011/0012099 A1* | 1/2011 | Yersin | C09K 11/06 257/40 |
| 2013/0231482 A1* | 9/2013 | Narayana Rao | C07F 1/00 546/4 |
| 2016/0145284 A1* | 5/2016 | Sengupta | C07F 15/0086 514/24 |

OTHER PUBLICATIONS

Chen, et al. "Tuning the saturated red emission: synthesis, electrochemistry and photophysics of 2-arylquinoline based iridium (III) complexes and their application in OLEDs." Journal of Materials Chemistry 16.32 (2006): 3332-3339.*

David, et al. "Gold (III) compounds containing a chelating, dicarbanionic ligand derived from 4, 4'-di-tert-butylbiphenyl." Dalton Transactions 43.28 (2014): 11059-11066.*

Garg, et al. "Stable and tunable phosphorescent neutral cyclometalated Au (III) diaryl complexes." Inorganic chemistry 49.24 (2010) : 11463-11472.*

Usón, et al. "Synthesis and reactivity of dibenzometallole complexes of gold (III) and platinum (II)." Journal of Organometallic Chemistry 198.1 (1980): 105-112.*

Zhu, et al. "Highly Efficient Green and Blue-Green Phosphorescent OLEDs Based on Iridium Complexes with the Tetraphenylimidodiphosphinate Ligand." Advanced Materials 23.35 (2011): 4041-4046.*

Shavaleev, et al. "Deep-red luminescence and efficient singlet oxygen generation by cyclometalated platinum (II) complexes with 8-hydroxyquinolines and quinoline-8-thiol." Inorganic chemistry 45.23 (2006): 9410-9415.*

Machine Translation of JP 2006083353 A.*

Li, et al. "Highly efficient green phosphorescent OLEDs based on a novel iridium complex." Journal of Materials Chemistry C 1.3 (2013): 560-565.*

Chan, et al. "Strongly Luminescent Cyclometalated Gold (III) Complexes Supported by Bidentate Ligands Displaying Intermolecular Interactions and Tunable Emission Energy." Chemistry—An Asian Journal 12.16 (2017): 2104-2120.*

Nilakantan, et al. "Emissive biphenyl cyclometalated gold (III) diethyl dithiocarbamate complexes." Organometallics 35.14 (2016): 2339-2347.*

* cited by examiner

GOLD COMPLEXES FOR OLED APPLICATIONS

CROSS REFERENCE TO RELATED APPLICATIONS

This application claims priority to provisional application Ser. No. 62/146,636, filed on Apr. 13, 2015, which is incorporated herein by reference.

TECHNICAL FIELD

This disclosure relates to a class of gold emitters, their preparation, and their applications in organic light-emitting diodes (OLEDs).

BACKGROUND

There has been a constant interest in the research on luminescent materials for OLED applications, whether to find suitable dopant material or to optimize the device structure to effect high quantum efficiency, long device lifetime or color tuning. Ir(III) and Pt(II) complexes dominate the research field. They are highly regarded for the outstanding luminescence quantum yield and stability.

To have these desirable properties, the structural design of the ligand apart from the choice of metal ion plays the determining role. A common practice is to use multidentate cyclometalating ligands. These multidentate ligands usually contain strong field donor atoms like C— or O— to remove the low-lying non-emissive metal-centered (MC) excited states. At the same time there is chelate effect endowed by multidentate ligands instead of monodentate ligands, which could render thermal stability to the complex.

Over the past two decades, the research in luminescent gold(III) compounds has surged. Luminescent Au(II) complexes exist. But the structural design relies heavily on cyclometallated tridentate complexes accompanied by an ancillary strong σ-donor, usually a carbanion. Only this kind of gold(III) complexes have been utilized in OLEDs devices. Relatively small number of high performance devices have been realized though the solution quantum efficiencies of these complexes. Nevertheless, the long term stability of these OLEDs may be affected by the relatively weak binding force between the gold(III) center and the auxiliary monodentate ligand.

SUMMARY

The subject matter herein relates to gold(III) emitters with high solution emission quantum efficiency and their applications in OLEDs. The gold(III) emitters described herein have largely improved the emission quantum and stability of gold(III) complexes for OLED fabrication.

In one embodiment, the gold(III)-based emitters are metal complexes with a chemical structure of Structure I:

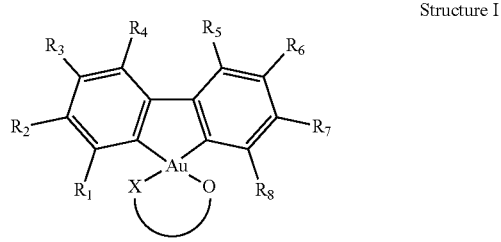

Structure I wherein $R_1$-$R_8$ are independently hydrogen, halogen, hydroxyl, an unsubstituted alkyl, a substituted alkyl, alkylamino, cycloalkyl, an unsubstituted aryl, a substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or an alkoxycarbonyl group. Any pair of adjacent R groups of $R_1$-$R_8$ can be independently form 5-8 member ring(s) with 2 or 4 carbon atoms in the phenyl ring(s) showed in Structure I; and

is an emission turn on group.

The subject matter herein also provides devices fabricated from the gold(III) emitters of Structure I.

DETAILED DESCRIPTION

Definitions

Figure 1:
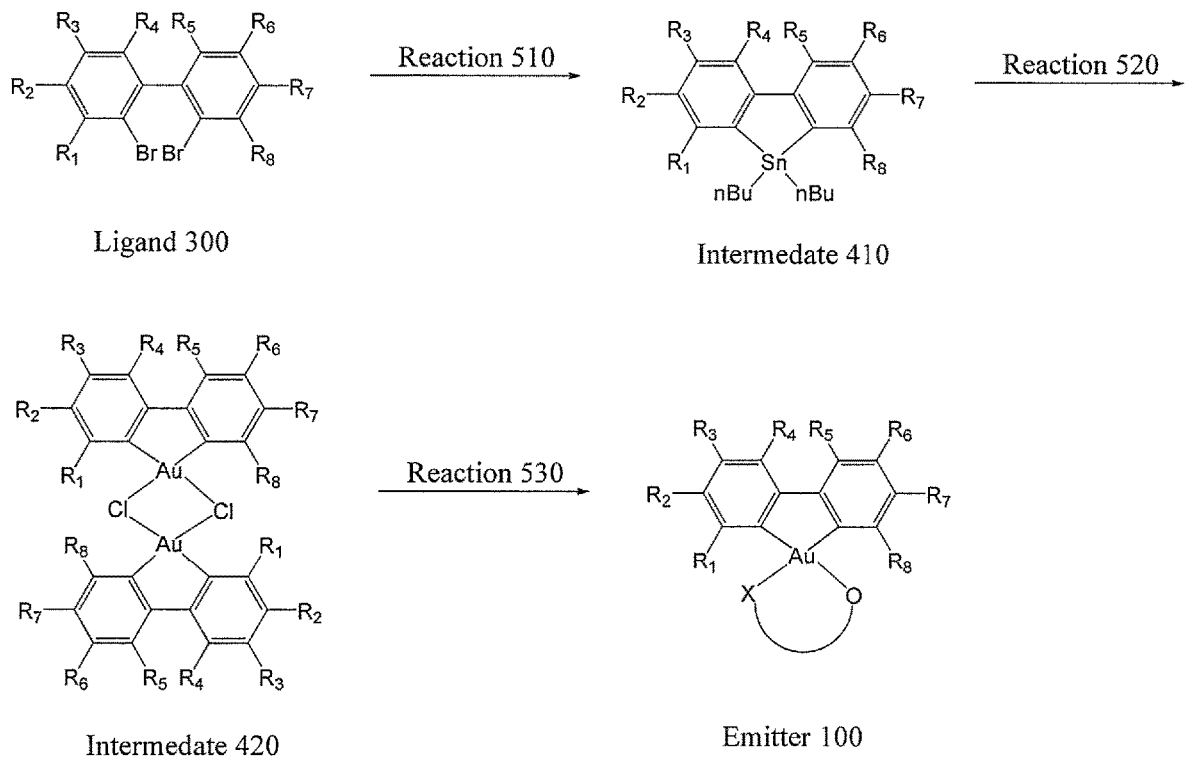
FIG. 1 depicts the Synthetic Scheme of making the Emitter 100.
Figure 2:
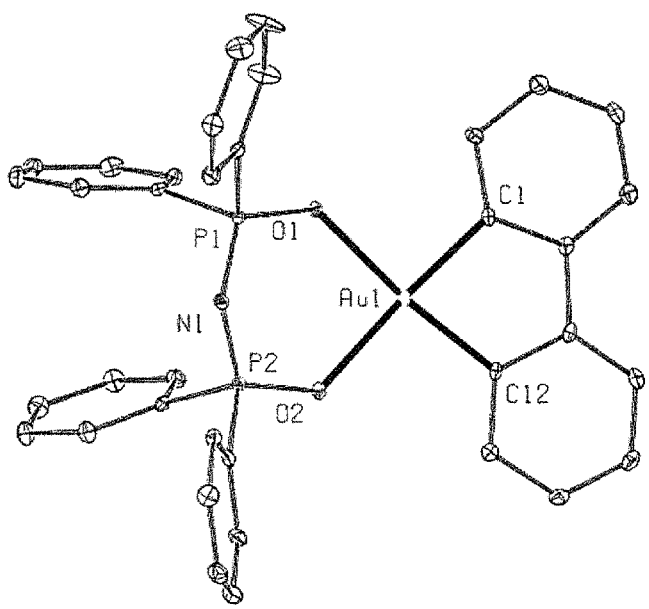
FIG. 2 is an ORTEP diagram of 102 with ellipsoids shown at 30% probability level with hydrogen atoms and solvents molecules omitted for clarity.
Figure 3:
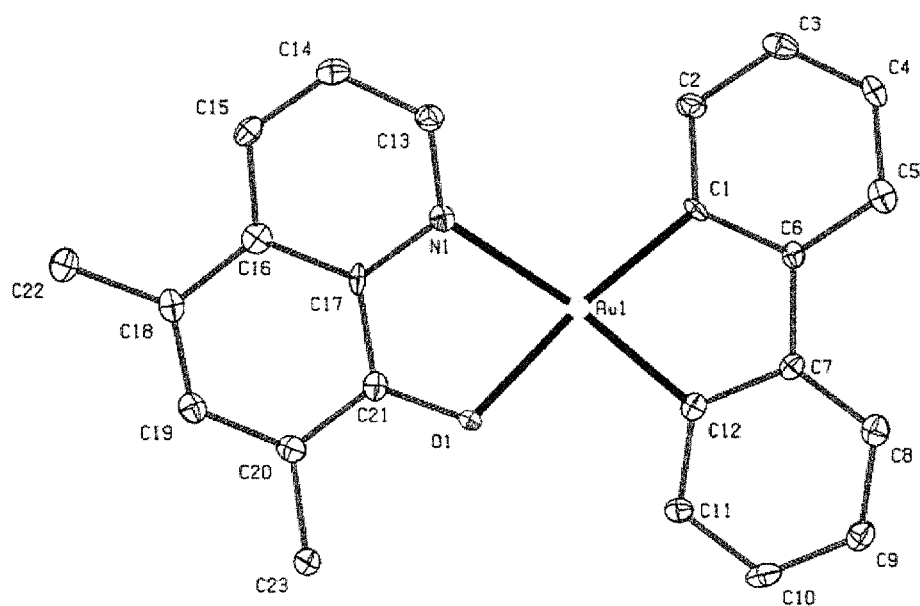
FIG. 3 is an ORTEP diagram of 104 with ellipsoids shown at 30% probability level with hydrogen atoms and solvents molecules omitted for clarity.
Figure 4:
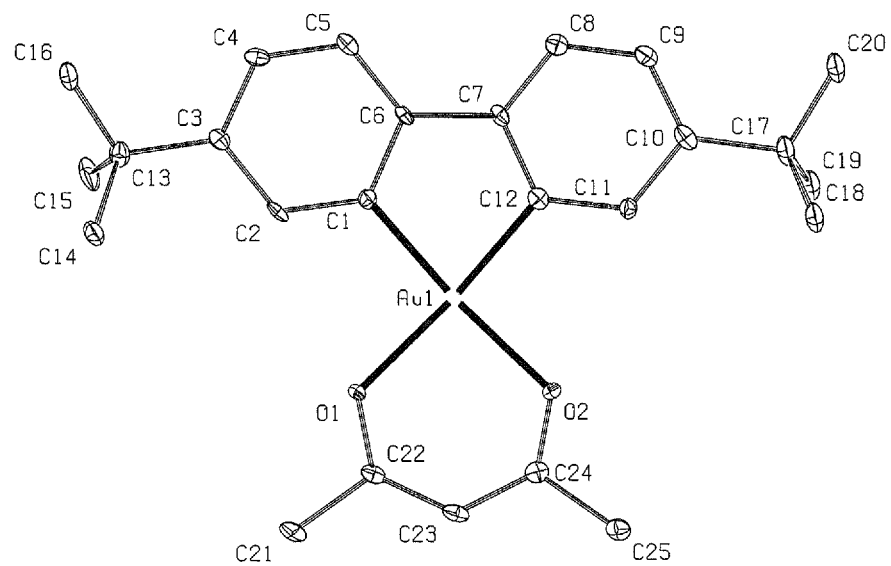
FIG. 4 is an ORTEP diagram of 107 with ellipsoids shown at 30% probability level with hydrogen atoms and solvents molecules omitted for clarity.
Figure 5:
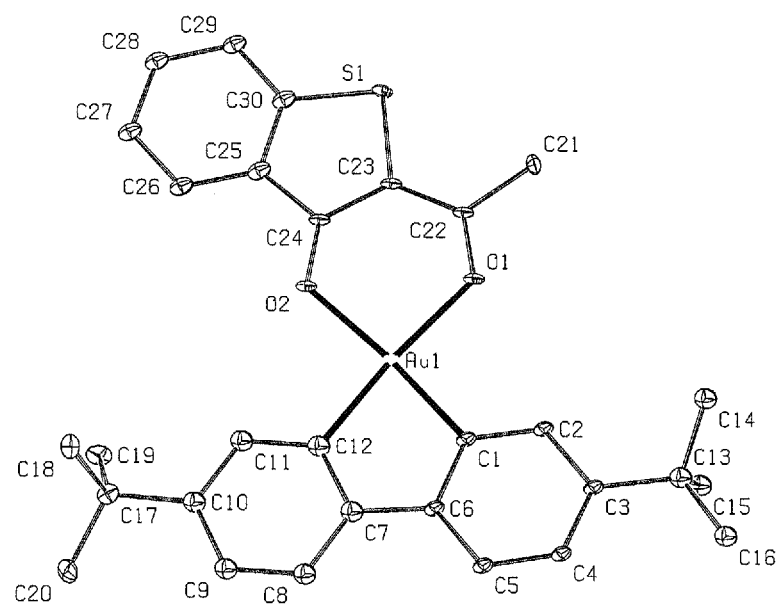
FIG. 5 is an ORTEP diagram of 109 with ellipsoids shown at 30% probability level with hydrogen atoms and solvents molecules omitted for clarity.

To facilitate the understanding of the subject matter disclosed herein, a number of terms, abbreviations or other shorthand as used herein are defined below. Any term, abbreviation or shorthand not defined is understood to have the ordinary meaning used by a skilled artisan contemporaneous with the submission of this application.

"Amino" refers to a primary, secondary, or tertiary amine which may be optionally substituted. Specifically included are secondary or tertiary amine nitrogen atoms which are members of a heterocyclic ring. Also specifically included, for example, are secondary or tertiary amino groups substituted by an acyl moiety. Some non-limiting examples of an amino group include —NR'R" wherein each of R' and R" is independently H, alkyl, aryl, aralkyl, alkaryl, cycloalkyl, acyl, heteroalkyl, heteroaryl or heterocycyl.

"Alkyl" refers to a fully saturated acyclic monovalent radical containing carbon and hydrogen, and which may be branched or a straight chain. Examples of alkyl groups include, but are not limited to, methyl, ethyl, n-propyl, isopropyl, n-butyl, t-butyl, n-heptyl, n-hexyl, n-octyl, and n-decyl.

"Alkylamino" means a radical —NHR or —NR$_2$ where each R is independently an alkyl group. Representative examples of alkylamino groups include, but are not limited to, methylamino, (1-methylethyl)amino, methylamino, dimethylamino, methylethylamino, and di(1-methylethyl)amino.

The term "hydroxyalkyl" means an alkyl radical as defined herein, substituted with one or more, preferably one, two or three hydroxy groups. Representative examples of hydroxyalkyl include, but are not limited to, hydroxymethyl, 2-hydroxyethyl, 2-hydroxypropyl, 3-hydroxypropyl, 1-(hydroxymethyl)-2-methylpropyl, 2-hydroxybutyl, 3-hydroxybutyl, 4-hydroxybutyl, 2,3-dihydroxypropyl, 2-hydroxy-1-hydroxymethylethyl, 2,3-dihydroxybutyl, 3,4-dihydroxybutyl and 2-(hydroxymethyl)-3-hydroxy-propyl, preferably 2-hydroxyethyl, 2,3-dihydroxypropyl, and 1-(hydroxymethyl)2-hydroxyethyl.

The term "alkoxy," as used herein, refers the radical —OR$_x$. Exemplary alkoxy groups include, but are not limited to, methoxy, ethoxy, and propoxy.

"Aryl" refers to optionally substituted carbocyclic aromatic groups. In some embodiments, the aryl group includes phenyl, biphenyl, naphthyl, substituted phenyl, substituted biphenyl or substituted naphthyl. In other embodiments, the aryl group is phenyl or substituted phenyl.

"Aralkyl" refers to an alkyl group which is substituted with an aryl group. Some non-limiting examples of aralkyl include benzyl and phenethyl.

"Acyl" refers to a monovalent group of the formula —C(=O)H, —C(=O)-alkyl, —C(=O)-aryl, —C(=O)-aralkyl, or —C(=O)-alkaryl.

"Halogen" refers to fluorine, chlorine, bromine and iodine.

"Styryl" refers to a univalent radical C$_6$H$_5$—CH=CH— derived from styrene.

"Substituted" as used herein to describe a compound or chemical moiety refers to that at least one hydrogen atom of that compound or chemical moiety is replaced with a second chemical moiety. Non-limiting examples of substituents are those found in the exemplary compounds and embodiments disclosed herein, as well as halogen; alkyl; heteroalkyl; alkenyl; alkynyl; aryl; heteroaryl; hydroxy; alkoxyl; amino; nitro; thiol; thioether; imine; cyano; amido; phosphonato; phosphine; carboxyl; thiocarbonyl; sulfonyl; sulfonamide; ketone; aldehyde; ester; oxo; haloalkyl (e.g., trifluoromethyl); carbocyclic cycloalkyl, which can be monocyclic or fused or non-fused polycyclic (e.g., cyclopropyl, cyclobutyl, cyclopentyl or cyclohexyl) or a heterocycloalkyl, which can be monocyclic or fused or non-fused polycyclic (e.g., pyrrolidinyl, piperidinyl, piperazinyl, morpholinyl or thiazinyl); carbocyclic or heterocyclic, monocyclic or fused or non-fused polycyclic aryl (e.g., phenyl, naphthyl, pyrrolyl, indolyl, furanyl, thiophenyl, imidazolyl, oxazolyl, isoxazolyl, thiazolyl, triazolyl, tetrazolyl, pyrazolyl, pyridinyl, quinolinyl, isoquinolinyl, acridinyl, pyrazinyl, pyridazinyl, pyrimidinyl, benzimidazolyl, benzothiophenyl or benzofuranyl); amino (primary, secondary or tertiary); o-lower alkyl; o-aryl, aryl; aryl-lower alkyl; —CO$_2$CH$_3$; —CONH$_2$; —OCH$_2$CONH$_2$; —NH$_2$; —SO$_2$NH$_2$; —OCHF$_2$; —CF$_3$; —OCF$_3$; —NH(alkyl); —N(alkyl)$_2$; —NH(aryl); —N(alkyl)(aryl); —N(aryl)$_2$; —CHO; —CO(alkyl); —CO (aryl); —CO$_2$(alkyl); and —CO$_2$(aryl); and such moieties can also be optionally substituted by a fused-ring structure or bridge, for example —OCH$_2$O—. These substituents can optionally be further substituted with a substituent selected from such groups. All chemical groups disclosed herein can be substituted, unless it is specified otherwise. For example, "substituted" alkyl, alkenyl, alkynyl, aryl, hydrocarbyl or heterocyclo moieties described herein are moieties which are substituted with a hydrocarbyl moiety, a substituted hydrocarbyl moiety, a heteroatom, or a heterocyclo. Further, substituents may include moieties in which a carbon atom is substituted with a heteroatom such as nitrogen, oxygen, silicon, phosphorus, boron, sulfur, or a halogen atom. These substituents may include halogen, heterocyclo, alkoxy, alkenoxy, alkynoxy, aryloxy, hydroxy, protected hydroxy, keto, acyl, acyloxy, nitro, amino, amido, cyano, thiol, ketals, acetals, esters and ethers.

Gold(III) Emitters

In one aspect, the subject matter herein provides gold(III) emitters. In one embodiment, an organometallic emitter represented by Structure I is provided. The gold center in Structure I is in the +3 oxidation state and has a square planar geometry. The coordination sites of the gold center are occupied by two bidentate ligands: a biphenyl type ligand and an emission turn on unit. The biphenyl type ligand featuring with a 5 fused membered ring coordinates to the gold center through two metal-carbon bonds.

The emission turn on unit featuring with a 5 or 6 fused membered ring coordinates to the gold center through two metal-oxygen bonds or one metal-oxygen and one metal-nitrogen bond or one metal-phosphorus bond. It is important to have this unit because gold(II) complexes with biphenyl type ligands were found non-emissive in solution at room temperature when this unit is lacking.

In one embodiment, the emission turn on unit contains from 2 to 26 carbon atoms and at least one oxygen atom. In another embodiment, the emission turn on unit contains from 4 to 25 carbon atoms and at least one oxygen atom.

The biphenyl type ligand must in −2 oxidation state and the emission turn on unit must in −1 oxidation to obtain an overall charge neutral emitter.

In one embodiment, the gold(III) emitters have the chemical structures of Structure I:

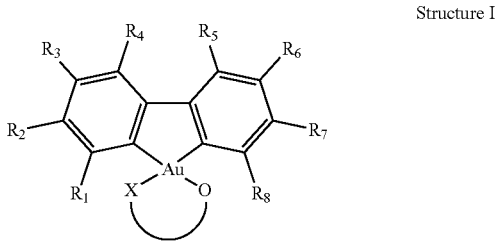

Structure I wherein R$_1$-R$_8$ are independently hydrogen, halogen, hydroxyl, an unsubstituted alkyl, a substituted alkyl, alkylamino, cycloalkyl, an unsubstituted aryl, a substituted aryl, acyl, alkoxy, acyloxy, amino, nitro, acylamino, aralkyl, cyano, carboxyl, thio, styryl, aminocarbonyl, carbamoyl, aryloxycarbonyl, phenoxycarbonyl, or an alkoxycarbonyl group. Each pair of adjacent R groups of R$_1$-R$_8$ can be independently form 5-8 member ring(s) with 2 or 4 carbon atoms in the phenyl ring(s) showed in Structure I;

is an emission turn on group.

In one embodiment, $R_1$-$R_8$ is independently hydrogen, halogen, hydroxyl, an unsubstituted alkyl containing from 1 to 10 carbon atoms, a substituted alkyl containing from 1 to 20 carbon atoms, cycloalkyl containing from 4 to 20 carbon atoms, an unsubstituted aryl containing from 6 to 20 carbon atoms, a substituted aryl containing from 6 to 20 carbon atoms, acyl containing from 1 to 20 carbon atoms, alkoxy containing from 1 to 20 carbon atoms, acyloxy containing from 1 to 20 carbon atoms, amino, nitro, acylamino containing from 1 to 20 carbon atoms, aralkyl containing from 1 to 20 carbon atoms, cyano, carboxyl containing from 1 to 20 carbon atoms, thiol, styryl, aminocarbonyl containing from 1 to 20 carbon atoms, carbamoyl containing from 1 to 20 carbon atoms, aryloxycarbonyl containing from 1 to 20 carbon atoms, phenoxycarbonyl containing from 1 to 20 carbon atoms, or an alkoxycarbonyl group containing from 1 to 20 carbon atoms.

In one embodiment, X is an oxygen atom.

In one embodiment, the emission turn-on unit is:

In one embodiment, the emission turn-on unit is:

In one embodiment, the emission turn-on unit is:

In one embodiment, the emission turn-on unit is:

In one embodiment, X is a nitrogen atom.

In one embodiment, the emission turn-on unit is:

In one embodiment, the emission turn-on unit is:

In one embodiment, X is a phosphorus atom.

In one embodiment, the emission turn-on unit is:

Certain specific, non-limiting examples for the gold(III) emitters with structure I are shown as follows:

Emitter 101

Emitter 102

Emitter 103

-continued
Emitter 104
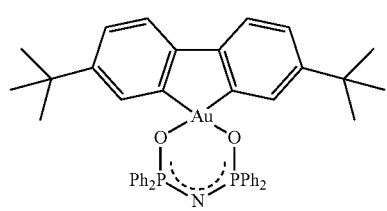
Emitter 105
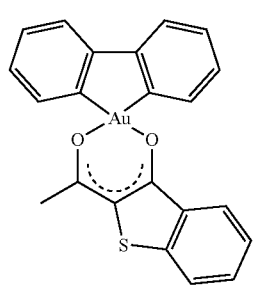
Emitter 106
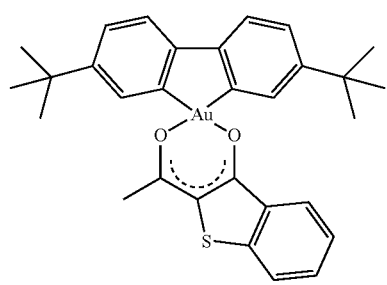
Emitter 107
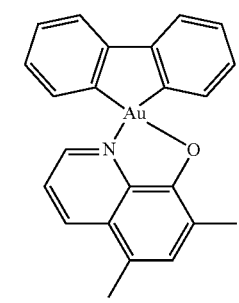
Emitter 108
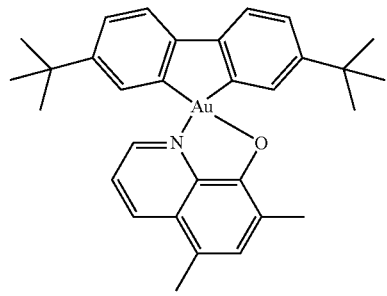
-continued
Emitter 109
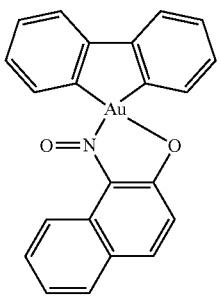
Emitter 110
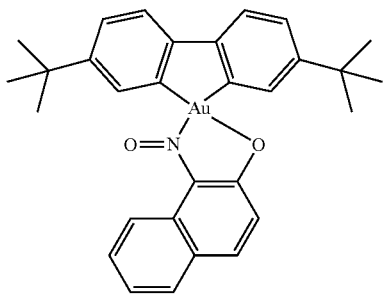
Emitter 111
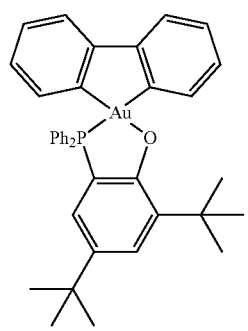
Emitter 112
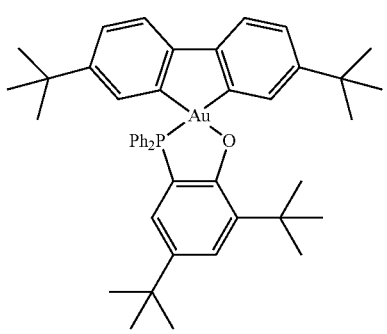
Emitter 113
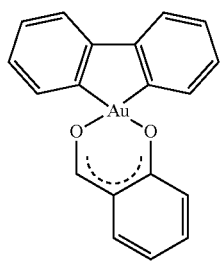

Emitter 114
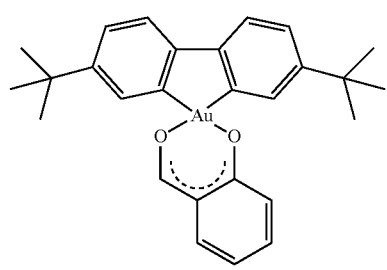
Emitter 115
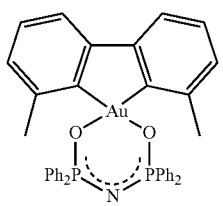
Emitter 116
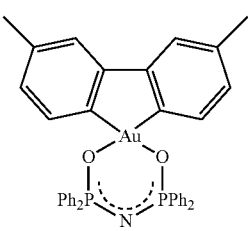
Emitter 117
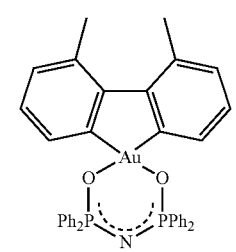
Emitter 118
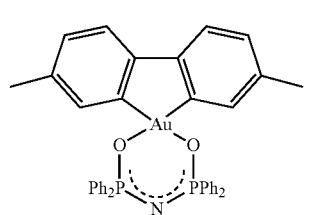
Emitter 119
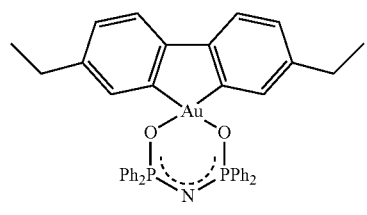
Emitter 120
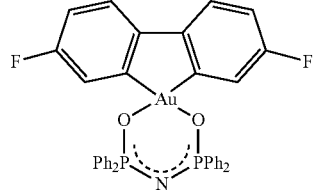
Emitter 121
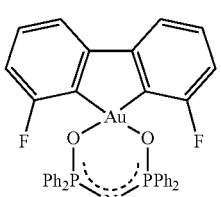
Emitter 122
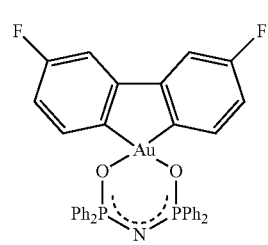
Emitter 123
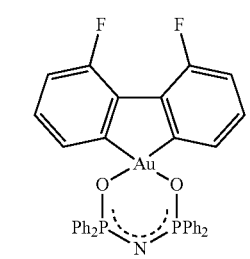
Emitter 124
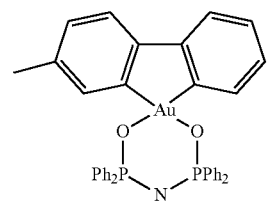
Emitter 125
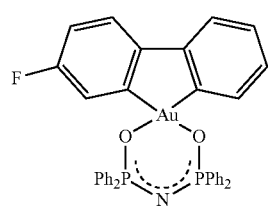
Emitter 126
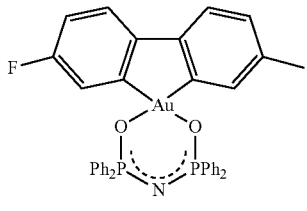
Emitter 127
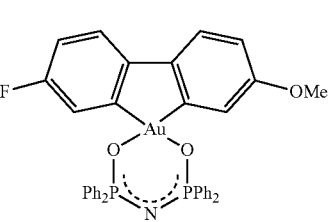

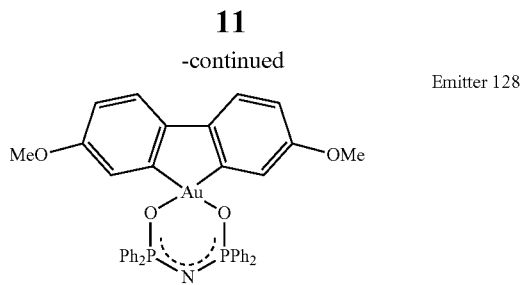

Emitter 128

Preparation of Gold(III) Emitter

The gold (III) emitter with Structure I can be prepared by a series of reactions depicted in FIG. 1.

According to FIG. 1, Intermediate 410 is prepared from Ligand 300 through Reaction 510. Afterward, it is transformed to Intermediate 420 with reaction 520. Finally, Emitter 100 is prepared from Intermediate 420 by Reaction 530.

In one embodiment, Reaction 510 is reacting Ligand 300 (such as a halo-substituted biphenyl compound) with n-butyl lithium at a suitable temperature and time, such as 77K for 2 hours, and then adding $SnBu_2Cl_2$ at room temperature.

In one embodiment, Reaction 520 is reacting Intermediate 410 (for example a dialkyl-biphenyl tin intermediate) with $HAuCl_4 \cdot 3H_2O$ in a suitable solvent or mix solvent.

In one embodiment, Reaction 530 is reacting Intermediate 420 (such as a multiphenyl dichloro bi-gold complex intermediate) with the deprotonated emission turn-on unit in a suitable solvent or mix solvent to provide the emitter.

The following examples illustrate the subject invention. Unless otherwise indicated in the following examples and elsewhere in the specification and claims, all parts and percentages are by weight, all temperatures are in degrees Centigrade, and pressure is at or near atmospheric pressure.

Example 601—Preparation of Intermediate 411

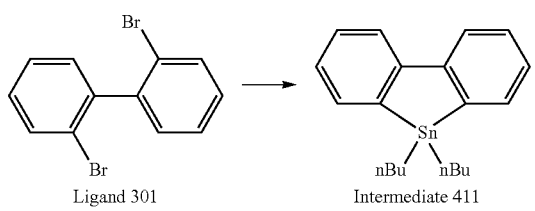

Ligand 301        Intermediate 411

Under $N_2$ at 77 K, n-BuLi (2.7 mL, 6.48 mmol) was added to Ligand 301 (1 g, 3.21 mmol) dissolved in 30 mL dry ether. The reaction mixture was immediately warmed to room temperature and stirred for 2 hours. Dibutyltin dichloride (0.98 g, 3.23 mmol) dissolved in 3 mL dry ether was syringed into the reaction mixture. The pale yellow blurred solution turned white milky after addition. After stirring at room temperature overnight, $H_2O$ was added and the organic layer was extracted. Removal of solvent yielded a pale yellow solid. Subsequent column chromatography with pure hexane yielded pure product as a white solid. Yield: 0.72 g (58.3%). $^1$H NMR (400 MHz, $CDCl_3$): δ 7.96 (d, 2H, J=7.82 Hz), 7.63 (d, 2H, $^{118}$Sn satellite, J=7.82 Hz, $J_{HPt}$=35.0 Hz), 7.40 (t, 2H, J=7.62 Hz), 7.28 (d, 2H, J=7.06 Hz), 1.58-1.66 (m, 4H), 1.31-1.39 (m, 8H), 0.87 (t, 6H, J=7.29 Hz).

Example 602—Preparation of Intermediate 412

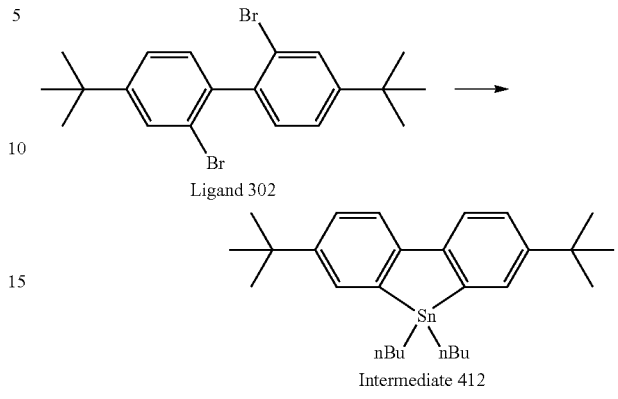

Ligand 302

Intermediate 412

The procedure is similar to that of example 601 except that Ligand 302 (1.4 g, 3.31 mmol) was used instead of Ligand 301. Yield: 0.70 g (42.6%). $^1$H NMR (400 MHz, $CDCl_3$): δ 7.84 (d, 2H, J=8.28 Hz), 7.62 (d, 2H, $^{118}$Sn satellite, J=1.97 Hz, $J_{HPt}$=36.1 Hz), 7.39 (dd, 2H, J=8.25 Hz, J=2.10 Hz), 1.64-1.69 (m, 4H), 1.31-1.42 (m, 26H), 0.89 (t, 6H, J=7.31 Hz).

Example 603—Preparation of Intermediate 421

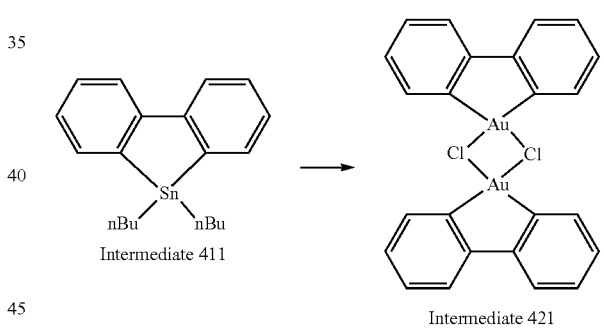

Intermediate 411

Intermediate 421

$HAuCl_4 \cdot 3H_2O$ (200 mg, 0.508 mmol) was dissolved in 20 mL MeCN. Intermediate 411 (200 mg, 0.52 mmol) was added. The mixture was heated to 80° C. and reacted overnight. The off-white precipitates were filtered and washed thoroughly with MeCN and $CHCl_3$. Yield: 77 mg (38.7%).

Example 604—Preparation of Intermediate 422

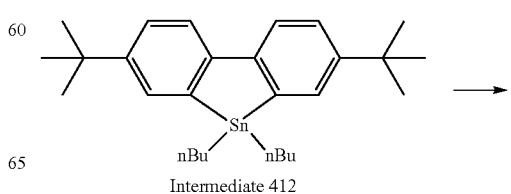

Intermediate 412

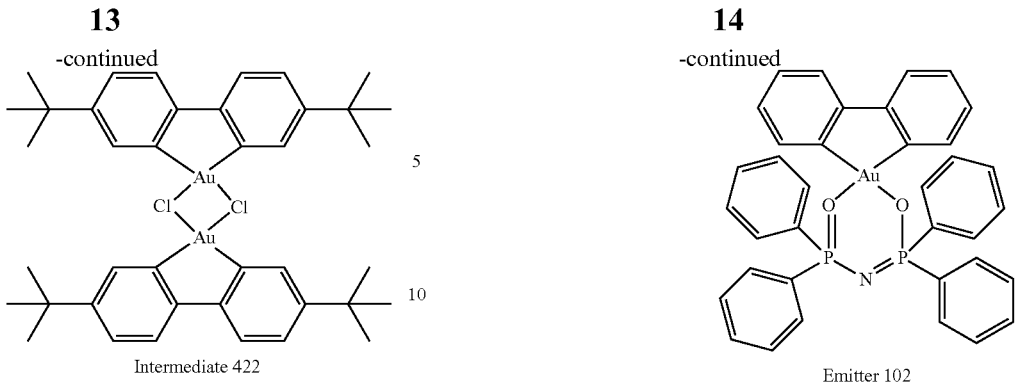

Intermediate 422

The procedure was similar to that of Intermediate 421 except that Intermediate 412 (252 mg, 0.507 mmol) was used. Yield: 128 mg (50.5%).

Example 605—Preparation of Emitter 101

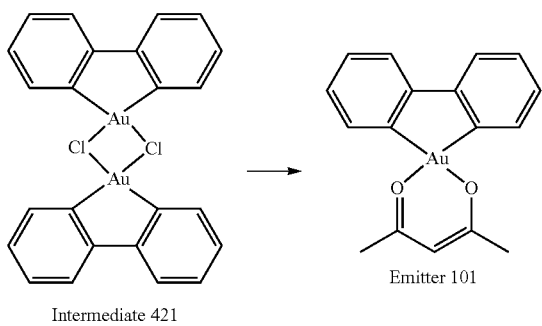

Na(acac) (10 mg, 0.08 mmol) was dissolved in a minimal amount of EtOH. 10 mL CHCl$_3$ was added. To the mixture, Intermediate 421 (30 mg, 0.039 mmol) was added and the temperature was raised to 50° C. The blurred solution became clearer overnight. Solvent was then evaporated under reduced pressure. The crude was re-dissolved in CHCl$_3$ and filtered through a celite plug. Precipitation of the product in MeOH afforded the product as a white solid. Yield: 16 mg (44.3%). $^1$H NMR (400 MHz, CDCl$_3$): δ 7.67 (d, 2H, J=7.69 Hz), 7.32 (d, 2H, J=7.53 Hz), 7.19 (t, 2H, J=7.41 Hz), 7.00 (t, 2H, J=7.55 Hz), 5.52 (s, 1H), 2.19 (s, 6H). Elemental analysis Calcd for C$_{17}$H$_{15}$AuO$_2$: C, 45.55; H, 3.37; O, 7.14. Found: C, 46.38; H, 3.50.

Example 606—Preparation of Emitter 102

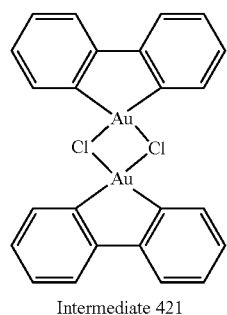

Intermediate 421

K(OPPh$_2$)$_2$N (61 mg, 0.130 mmol) was dissolved in a minimal amount of EtOH. 10 mL CHCl$_3$ was added. To the mixture, Intermediate 421 (50 mg, 0.065 mmol) was added and the temperature was raised to 50° C. and allowed to react for 2 h. The colorless solution with some metallic deposit was filtered through a celite plug. Solvent was then evaporated under reduced pressure. Precipitation of the product in MeOH afforded the product as a white solid. Recrystallization in CHCl$_3$/hexane yielded Emitter 102 as colorless crystals. Yield: 45 mg (45.2%). MS (FAB) m/z: 765.8 [M$^+$]. $^1$H NMR (400 MHz, CDCl$_3$): δ 7.84-7.90 (m, 8H), 7.72 (d, 2H, J=7.78 Hz), 7.38-7.41 (m, 4H), 7.33-7.36 (m, 8H), 7.27-7.32 (m, 2H), 7.17 (t, 2H, J=7.47 Hz), 6.98 (t, 2H, J=7.58 Hz); $^{31}$P NMR (162 MHz, CDCl$_3$): δ 28.8; $^{13}$C NMR (150 MHz, CDCl$_3$): δ 121.4, 126.6, 128.2, 128.3 (J$_{CP}$=13.64 Hz) 128.4, 129.5, 131.1, 131.2, 136.0 ($^3$J$_{CP}$=3.24 Hz), 136.9 ($^3$J$_{CP}$=3.24 Hz) 148.1, 151.7. Elemental analysis Calcd for C$_{36}$H$_{28}$AuNO$_2$P$_2$: C, 56.48; H, 3.69; N, 1.83. Found: C, 56.45; H, 3.61; N, 1.93.

Example 607—Preparation of Emitter 103

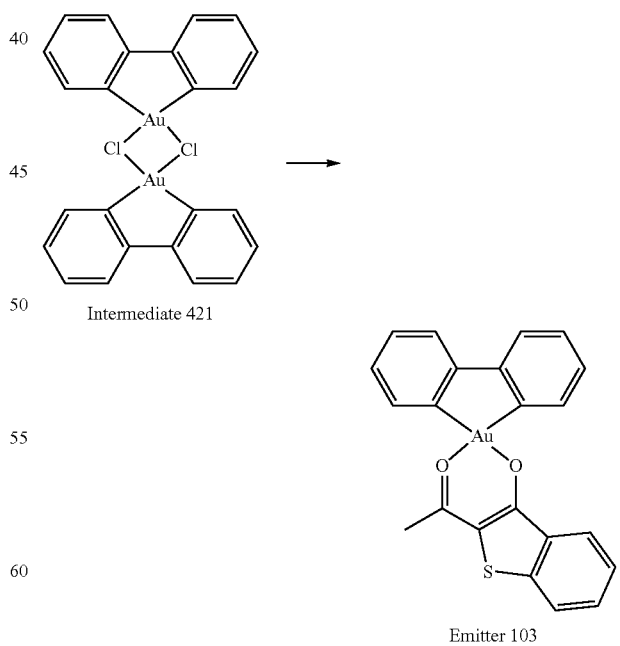

K$_2$CO$_3$ powder (25 mg, 0.18 mmol) was suspended in small amount of EtOH was added to 1-(3-hydroxybenzo[b]thiophen-2-yl)ethanone (17.6 mg, 0.092 mmol) dissolved in 10 mL CHCl$_3$. The mixture was heated to 50° C. followed by the addition of Intermediate 421 (35 mg, 0.046 mmol). After reaction overnight, the yellow suspension was filtered and re-dissolved in THF. The THF solution was filtered through celite. Recrystallization in THF/hexane afforded Emitter 103 as a yellow solid. Yield: 22 mg (37.1%). $^1$H NMR (400 MHz, CDCl$_3$): δ 7.84-7.90 (m, 8H), 7.72 (d, 2H, J=7.78 Hz), 7.35-7.43 (m, 12H), 7.27-7.32 (m, 2H), 7.17 (t, 2H, J=7.47 Hz), 6.98 (t, 2H, J=7.58 Hz). Elemental analysis Calcd for C$_{22}$H$_{15}$AuO$_2$S: C, 48.9; H, 2.8. Found: C, 49.06; H, 2.80.

Example 608—General Procedure for Emitter 104-106

K$_2$CO$_3$ powder (4 eq.) was suspended in EtOH. It was added to R—OH (2 eq.) dissolved in CHCl$_3$. The mixture was heated to 50° C. for 10 minutes after which Intermediate 421 (1 eq.) was added. The mixture was allowed to react overnight. Solvent was then evaporated under reduced pressure. The crude was re-dissolved in CHCl$_3$ and filtered through a celite plug. Removal of solvents yielded products. Subsequent purifications by recrystallization were required.

Example 609—Preparation of Emitter 104

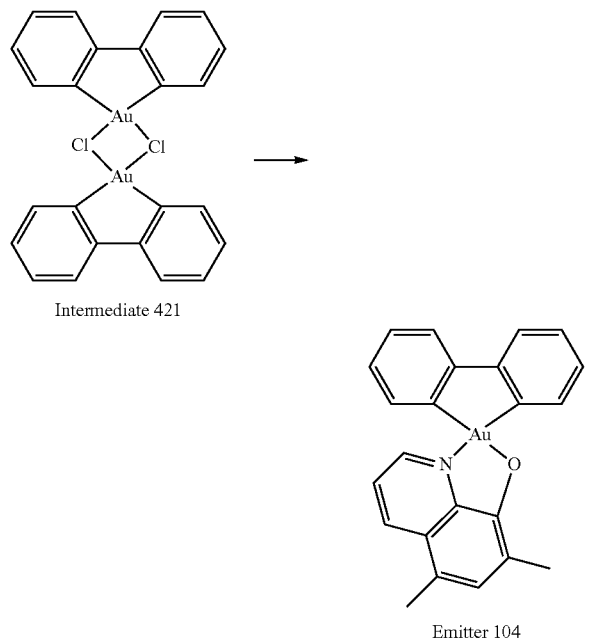

Followed Example 608 using 5,7-Dimethyl-8-quinolinol as R—OH. Yield: 66.4%. MS (FAB) m/z: 521.1 [M$^+$]. $^1$H NMR (400 MHz, CDCl$_3$): δ 9.04 (d, 1H, J=4.88 Hz), 8.52 (d, 1H, J=8.38 Hz), 8.13 (d, 1H, J=7.7 Hz), 7.61-7.64 (m, 1H), 7.57 (d, 1H, J=7.67 Hz), 7.44 (d, 1H, J=7.50 Hz), 7.36-7.38 (m, 2H), 7.21-7.25 (m, 2H), 7.05-7.13 (m, 2H), 2.61 (s, 1H), 2.59 (s, 1H). Elemental analysis Calcd for C$_{23}$H$_{18}$AuNO: C, 52.99; H, 3.48; N, 2.69. Found: C, 52.91; H, 3.53; N, 2.80.

Example 609—Preparation of Emitter 105

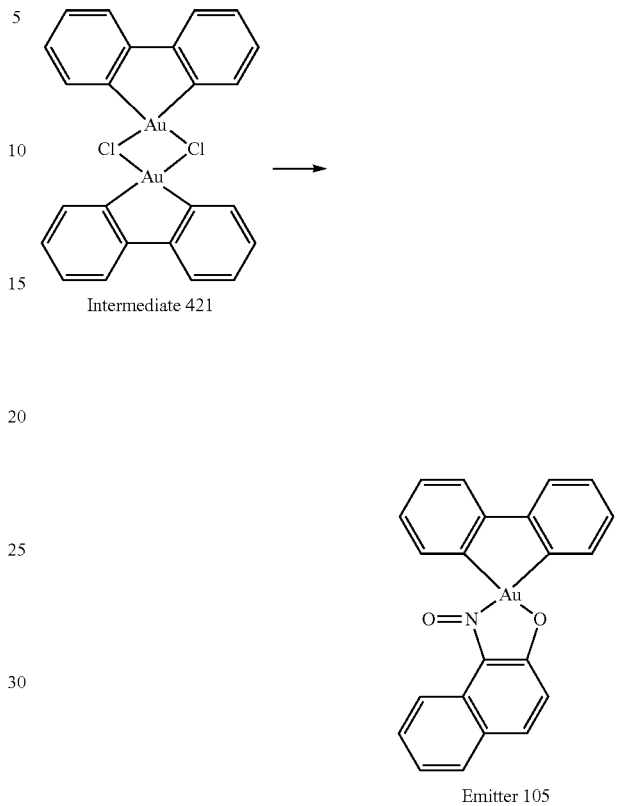

Followed Example 608 using 1-nitrosonaphthalen-2-ol as R—OH. Yield: 54.1%. MS (FAB) m/z: 522.3 [M$^+$]. $^1$H NMR (400 MHz, CDCl$_3$): δ 9.35 (d, 1H, J=8.32 Hz), 8.20 (d, 1H, J=8.05 Hz), 7.89 (d, 1H, J=9.38 Hz), 7.62-7.72 (m, 3H), 7.49 (t, 1H, J=7.43 Hz), 7.31 (d, 2H, J=7.48 Hz), 7.17-7.22 (m, 2H), 7.07-7.12 (m, 2H), 7.00 (t, 1H, J=7.46 Hz). Elemental analysis Calcd for C$_{22}$H$_{14}$AuNO$_2$: C, 50.69; H, 2.71; N, 2.69. Found: C, 50.65; H, 2.74; N, 2.82.

Example 610—Preparation of Emitter 106

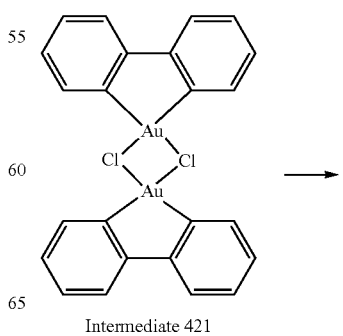

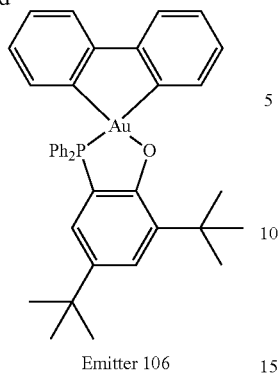

Emitter 106

Followed Example 608 using 2,4-di-tert-butyl-6-(diphenylphosphino)phenol as R—OH. Yield: 47.1%. MS (FAB) m/z: 734 [M+]. $^1$H NMR (400 MHz, CDCl$_3$): δ 8.23 (t, 1H, J=7.94 Hz), 7.69-7.74 (m, 4H), 7.34-7.54 (m, 9H), 7.18-7.24 (m, 3H), 7.11 (t, 1H, J=7.49 Hz), 6.89 (dd, 1H, J=2.24 Hz; J=10.4 Hz), 6.69 (t, 1H, J=7.52 Hz), 1.59 (s, 9H), 1.22 (s, 9H). Elemental analysis Calcd for C$_{38}$H$_{38}$AuOP: C, 61.79; H, 5.19. Found: C, 61.75; H, 5.16.

Example 611—Preparation of Emitter 107

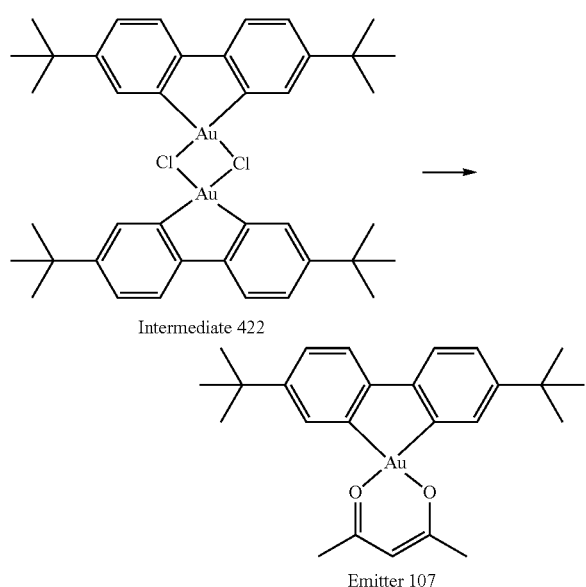

Intermediate 422

Emitter 107

Na(acac) (12.2 mg, 0.1 mmol) was dissolved in a minimal amount of EtOH. 10 mL CHCl$_3$ was added. To the mixture, Intermediate 422 (50 mg, 0.05 mmol) was added and the temperature was raised to 50° C. The blurred solution turned clearer quickly. After heating overnight, solvent was evaporated under reduced pressure. The crude was re-dissolved in CHCl$_3$ and filtered through a celite plug. Precipitation of the product in MeOH afforded the product as a white solid. Yield: 45 mg (79.8%). MS (FAB) m/z: 560.3 [M+]. $^1$H NMR (400 MHz, CDCl$_3$): δ 7.70 (s, 2H), 7.20 (s, 4H), 5.51 (s, 1H), 2.19 (s, 6H), 1.35 (s, 18H). Elemental analysis Calcd for C$_{25}$H$_{31}$AuO$_2$: C, 53.57; H, 5.57. Found: C, 53.24; H, 5.59.

Example 612—Preparation of Emitter 108

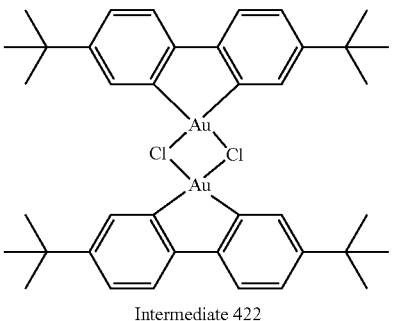

Intermediate 422

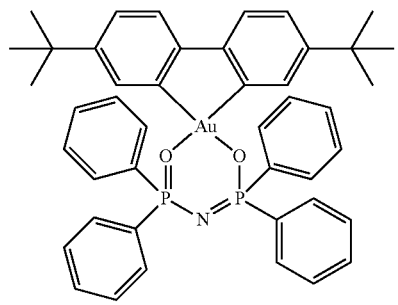

Emitter 108

K(OPPh$_2$)$_2$N (47 mg, 0.10 mmol) was dissolved in a minimal amount of EtOH. 10 mL CHCl$_3$ was added. To the mixture, Intermediate 422 (50 mg, 0.05 mmol) was added and the temperature was raised to 50° C. and allowed to react for 2 h. The colorless solution with some metallic deposit was filtered through a celite plug. Solvent was then evaporated under reduced pressure. Precipitation of the product in MeOH afforded the product as a white solid. Recrystallization in CHCl$_3$/hexane yielded a pure colorless crystal. Yield: 73 mg (82.6%). MS (FAB) m/z: 878.5 [M+]. $^1$H NMR (400 MHz, CDCl$_3$): δ 7.86-7.91 (m, 8H), 7.78 (s, 2H), 7.31-7.41 (m, 12H), 7.15 (s, 4H), 1.34 (s, 18H); $^{31}$P NMR (CDCl$_3$): δ 28.6. Elemental analysis Calcd for C$_{44}$H$_{44}$AuNO$_2$P$_2$: C, 60.21; H, 5.05; N, 1.60. Found: C, 60.08; H, 5.07; N, 1.75.

Example 613—Preparation of Emitter 109

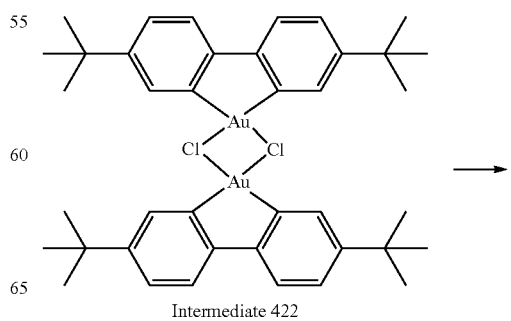

Intermediate 422

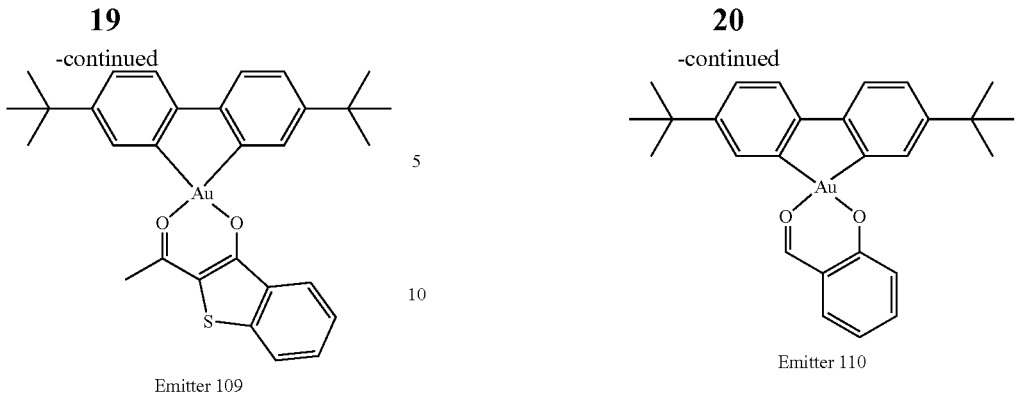

Emitter 109

Emitter 110

K₂CO₃ powder (22 mg, 0.159 mmol) was suspended in 2 mL EtOH. It was added to 2-acetyl-3-hydroxybenzo[b]thiophene (15.4 mg, 0.080 mmol) dissolved in 10 mL CHCl₃. The mixture was heated to 50° C. for 10 minutes after which Intermediate 422 (40 mg, 0.040 mmol) was added. The mixture becomes clear within 2 h. Solvent was then evaporated under reduced pressure. The crude was re-dissolved in CHCl₃ and filtered through a celite plug. Removal of solvents yielded products. Recrystallization in CHCl₃/hexane mixture yielded pure yellow solids. Yield: 35 mg (66.6%). MS (FAB) m/z: 652.3 [M⁺]. ¹H NMR (300 MHz, CDCl₃): δ 8.08 (d, 1H, J=7.86 Hz), 7.96 (s, 1H), 7.78 (s, 1H), 7.66 (d, 1H, J=7.94 Hz), 7.59 (t, 1H, J=7.40 Hz), 7.23 (s, 2H), 7.22 (s, 2H), 2.63 (s, 3H), 1.44 (s, 9H), 1.38 (s, 9H). Elemental analysis Calcd for C₃₀H₃₁AuO₂S: C, 55.21; H, 4.79. Found: C, 55.19; H, 4.79.

Example 614—Preparation of Emitter 110

K₂CO₃ powder (17 mg, 0.123 mmol) was suspended in 2 mL EtOH. It was added to salicylaldehyde (8 mg, 0.065 mmol) dissolved in THF. The mixture was heated to 50° C. for 10 minutes after which Intermediate 422 (30 mg, 0.030 mmol) was added. The mixture becomes clear within 2 hours. Solvent was then evaporated under reduced pressure. The crude was re-dissolved in THF and filtered through a celite plug. Precipitation induced by MeOH in a concentrated THF solution yielded yellow solids. Yield: 13 mg (37.0%). MS (FAB) m/z: 582.2 [M⁺]. ¹H NMR (400 MHz, CDCl₃): δ 9.47 (s, 1H), 7.87 (s, 1H), 7.70 (s, 1H), 7.64 (t, 1H, J=7.72 Hz), 7.46 (d, 1H, J=8.20 Hz), 7.19-7.22 (m, 4H), 7.05 (d, 1H, J=8.80 Hz), 6.72 (t, 1H, J=7.40 Hz), 1.39 (s, 18H).

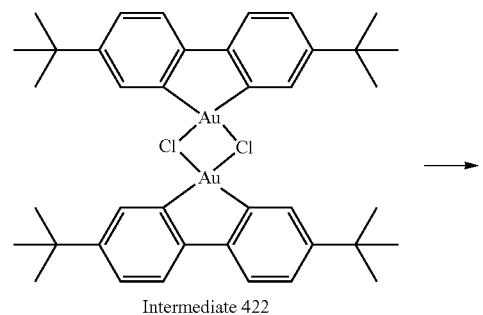

Intermediate 422

Example 615—Summary of Interplanar Distance and Au . . . Au Distance Between Adjacent Molecules of Emitters 102, 104, 107 and 109

| Emitter | Interplanar distance/Å | Au . . . Au distance/Å |
|---|---|---|
| 102 | n/a | n/a |
| 104 | 3.36 | 4.3998(4) |
| 107 | 3.31 | 3.4083(4) |
| 109 | ca. 3.4 | 3.4530(5) |

Example 616—Selected Bond Lengths and Angles of Emitters 102, 104, 107 and 109

| | 102 | | 104 | | 107 |
|---|---|---|---|---|---|
| Au1—C1 | 1.992(4) | Au1—C1 | 2.024(6) | Au1—C1 | 2.002(8) |
| Au1—C12 | 2.003(4) | Au1—C12 | 2.001(7) | Au1—C12 | 1.994(8) |
| Au1—O1 | 2.122(3) | Au1—O1 | 2.054(4) | Au1—O1 | 2.074(5) |
| Au1—O2 | 2.132(2) | Au1—N1 | 2.137(6) | Au1—O2 | 2.070(5) |
| C1—C6 | 1.405(5) | C1—C6 | 1.417(9) | C1—C6 | 1.41(1) |
| C7—C12 | 1.410(5) | C7—C12 | 1.395(9) | C7—C12 | 1.41(1) |
| O1—P1 | 1.522(2) | O1—C21 | 1.329(8) | O1—C22 | 1.280(9) |
| O2—P2 | 1.525(3) | N1—C17 | 1.370(9) | O2—C24 | 1.266(9) |
| N1—P1 | 1.591(3) | | | | |
| N1—P2 | 1.596(3) | | | | |
| C1—Au1—C12 | 81.6(2) | C1—Au—C12 | 80.6(3) | C1—Au1—C12 | 81.3(3) |
| O1—Au1—O2 | 92.6(1) | O1—Au1—N1 | 80.0(2) | O1—Au1—O2 | 91.7(2) |
| C1—Au1—O2 | 175.6(1) | C1—Au1—O1 | 173.5(2) | C1—Au1—O2 | 174.5(3) |
| C12—Au1—O1 | 172.3(1) | C12—Au1—N1 | 172.8(2) | C12—Au1—O1 | 174.4(3) |
| Au1—O1—P1 | 125.4(1) | Au1—N1—C17 | 110.5(4) | Au1—O1—C22 | 123.3(5) |
| Au1—O2—P2 | 125.1(1) | Au1—O1—C21 | 113.3(4) | Au1—O2—C24 | 123.5(5) |
| P1—N1—P2 | 124.2(2) | Au1—C1—C6 | 114.2(5) | C22—C23—C24 | 127.8(8) |
| C6—C1—Au1 | 115.6(3) | Au1—C12—C7 | 116.4(5) | C6—C1—Au1 | 115.7(5) |

-continued

| | | | | |
|---|---|---|---|---|
| C7—C12—Au1 | 114.8(3) | | C7—C12—Au1 | 115.0(5) |

| | 109 | | 109A | |
|---|---|---|---|---|
| | Au1—C1 | 2.008(9) | Au1—C1 | 2.006(9) |
| | Au1—C12 | 2.012(8) | Au1—C12 | 1.981(8) |
| | Au1—O1 | 2.081(6) | Au1—O1 | 2.095(6) |
| | Au1—O2 | 2.070(6) | Au1—O2 | 2.070(6) |
| | C1—C6 | 1.41(1) | C1—C6 | 1.40(1) |
| | C7—C12 | 1.38(1) | C7—C12 | 1.41(1) |
| | O1—C22 | 1.28(1) | O1—C22 | 1.27(1) |
| | O2—C24 | 1.28(1) | O2—C24 | 1.29(1) |
| | C1—Au1—C12 | 81.0(3) | C1—Au1—C12 | 81.5(4) |
| | O1—Au1—O2 | 91.4(2) | O1—Au1—O2 | 91.6(2) |
| | C1—Au1—O2 | 174.6(3) | C1—Au1—O2 | 174.8(3) |
| | C12—Au1—O1 | 174.6(5) | C12—Au1—O1 | 174.9(3) |
| | Au1—O1—C22 | 126.2(5) | Au1—O1—C22 | 125.6(5) |
| | Au1—O2—C24 | 123.2(5) | Au1—O2—C24 | 122.0(5) |
| | C22—C23—C24 | 128.2(8) | C22—C23—C24 | 127.6(8) |
| | C6—C1—Au1 | 115.4(6) | C6—C1—Au1 | 115.1(6) |
| | C7—C12—Au1 | 115.0(6) | C7—C12—Au1 | 116.3(6) |

Example 617—Crystal Data of Emitters 102, 104, 107 and 109

| Emitter | 102 | 104 | 107 | 109 |
|---|---|---|---|---|
| Empirical formula | C36H28AuNO2P2 | C23H18AuNO | C25H31AuO2 | C$_{30}$H$_{31}$AuO$_2$S |
| Formula weight | 765.5 | 521.35 | 560.46 | 652.57 |
| Temperature/K | 100 | 100 | 100 | 100 |
| Crystal system | monoclinic | monoclinic | monoclinic | monoclinic |
| Space group | P21/n | P21/n | C2/c | P2$_1$/c |
| a/Å | 13.1302(9) | 9.7011(5) | 28.6707(16) | 12.1735(7) |
| b/Å | 11.4856(8) | 8.5183(4) | 7.4093(4) | 14.2572(9) |
| c/Å | 19.8929(14) | 20.9099(10) | 20.8800(12) | 29.3295(18) |
| α/° | 90 | 90 | 90 | 90.00 |
| β/° | 98.741(2) | 93.282(2) | 90.804(2) | 100.8420(15) |
| γ/° | 90 | 90 | 90 | 90.00 |
| Volume/Å$^3$ | 2965.2(4) | 1725.09(15) | 4435.1(4) | 4999.6(5) |
| Z | 4 | 4 | 8 | 8 |
| ρ$_{calc}$g/cm$^3$ | 1.715 | 2.007 | 1.679 | 1.734 |
| μ/mm$^{-1}$ | 10.616 | 16.105 | 12.586 | 12.032 |
| F(000) | 1504 | 1000 | 2208 | 2576.0 |
| Crystal size/mm$^3$ | 0.3 × 0.05 × 0.05 | 0.1 × 0.04 × 0.03 | 0.3 × 0.03 × 0.03 | 0.04 × 0.03 × 0.01 |
| Radiation | CuKα (λ = 1.54178) | CuKα (λ = 1.54178) | CuKα (λ = 1.54178) | CuKα (λ = 1.54178) |
| 2θ range for data collection/° | 7.58 to 135.66 | 8.48 to 131.16 | 6.16 to 132.78 | 6.92 to 130.16 |
| Index ranges | −15 ≤ h ≤ 13, −13 ≤ k ≤ 13, −17 ≤ l ≤ 23 | −11 ≤ h ≤ 8, −10 ≤ k ≤ 8, −24 ≤ l ≤ 23 | −31 ≤ h ≤ 34, −8 ≤ k ≤ 8, −24 ≤ l ≤ 24 | −14 ≤ h ≤ 14, −16 ≤ k ≤ 15, −34 ≤ l ≤ 34 |
| Reflections collected | 40194 | 20901 | 22304 | 41130 |
| Independent reflections | 5317 [Rint = 0.0654, Rsigma = 0.0356] | 2876 [Rint = 0.0693, Rsigma = 0.0382] | 3889 [Rint = 0.0925, Rsigma = 0.0623] | 8462 [R$_{int}$ = 0.0819, R$_{sigma}$ = 0.0635] |
| Data/restraints/parameters | 5317/0/379 | 2876/0/237 | 3889/0/243 | 8462/0/357 |
| Goodness-of-fit on F$^2$ | 1.172 | 1.092 | 1.026 | 1.063 |
| Final R indexes [I >= 2σ (I)] | R1 = 0.0319, wR2 = 0.0882 | R1 = 0.0358, wR2 = 0.0943 | R1 = 0.0604, wR2 = 0.1545 | R$_1$ = 0.0779, wR$_2$ = 0.2000 |
| Final R indexes [all data] | R1 = 0.0320, wR2 = 0.0883 | R1 = 0.0375, wR2 = 0.0958 | R1 = 0.0660, wR2 = 0.1614 | R$_1$ = 0.0803, wR$_2$ = 0.2045 |
| Largest diff. peak/hole/e Å$^{-3}$ | 0.89/−1.57 | 1.24/−1.11 | 2.56/−2.30 | 2.08/−2.65 |

The ORETP diagrams are depicted in FIG. 2-FIG. 5

Example 618—Electrochemical Data of Emitters 101, 102, 103, 105, 107, 108 and 109

| Emitter | $E_{pa}$ or $E_{1/2}$ [V] | $E_{pc}$ or $E_{1/2}$ [V] | HOMO/LUMO [eV] | $E_{gap}$ [eV] |
|---|---|---|---|---|
| 101 | ** | ** | ** | ** |
| 102 | ** | ** | ** | ** |
| 103 | 1.03 | −2.15 | −5.83/−2.65 | 3.18 |
| 105 | 1.04 | −1.12*, −2.18 | −5.84/−3.79, −2.83 | na |
| 107 | 0.99* | −2.60 | −5.65/−2.47 | 3.18 |
| 108 | 1.06* | −2.43 | −5.58/−2.73 | 2.85 |
| 109 | 1.01, 1.28 | −2.12 | −5.66, −5.84/−2.84 | 2.81 |

Figure 6:
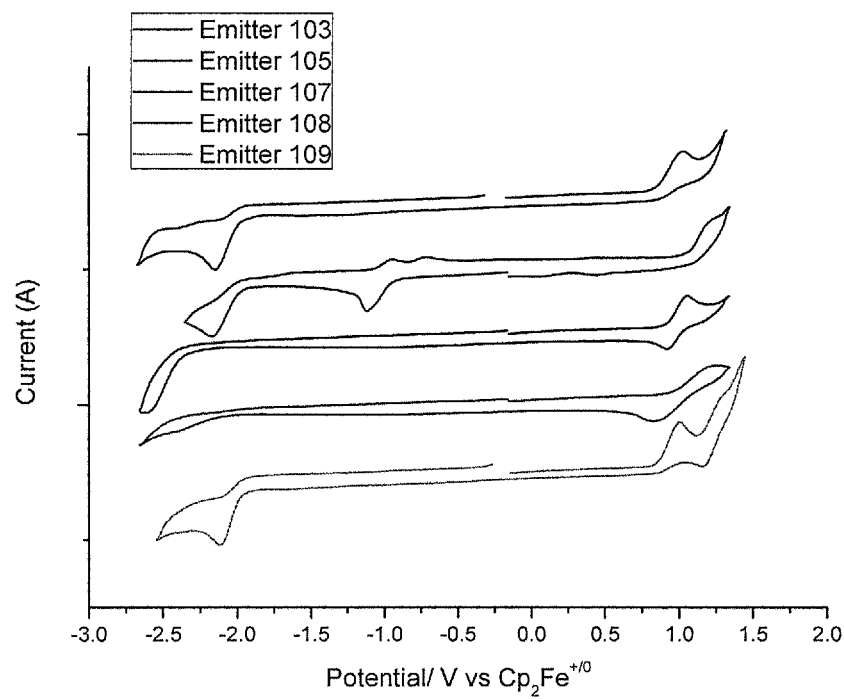
FIG. 6 depicts a graph of Cyclic voltammograms of Emitters 103, 105, 107, 108 and 109 shown in descending order.

$CH_2Cl_2$ at 298K with 0.1M $nBu_4NPF_6$; scan rate 100 mV s$^{-1}$
Value versus $Ag/AgNO_3$ (0.1M in $CH_3CN$) reference electrode
*For quasi-reversible process $E_{1/2} = (E_{pa} + E_{pc})/2$
The HOMO and LUMO levels are estimated from onset potentials using $Cp_2Fec^{0/+}$ value of 4.8 eV below the vacuum level.
** redox process not observed in the scan range The Cyclic voltammograms are depicted in FIG. 6 in descending order (Emitter 103 in the uppermost position while Emitter 109 is in the lowermost position).

Example 619—TGA Data of Emitters 102, 103 and 107

| Emitter | Decomposition Temperature/° C. |
|---|---|
| 102 | 305 |
| 103 | 280 |
| 107 | 280 |

Figure 7:
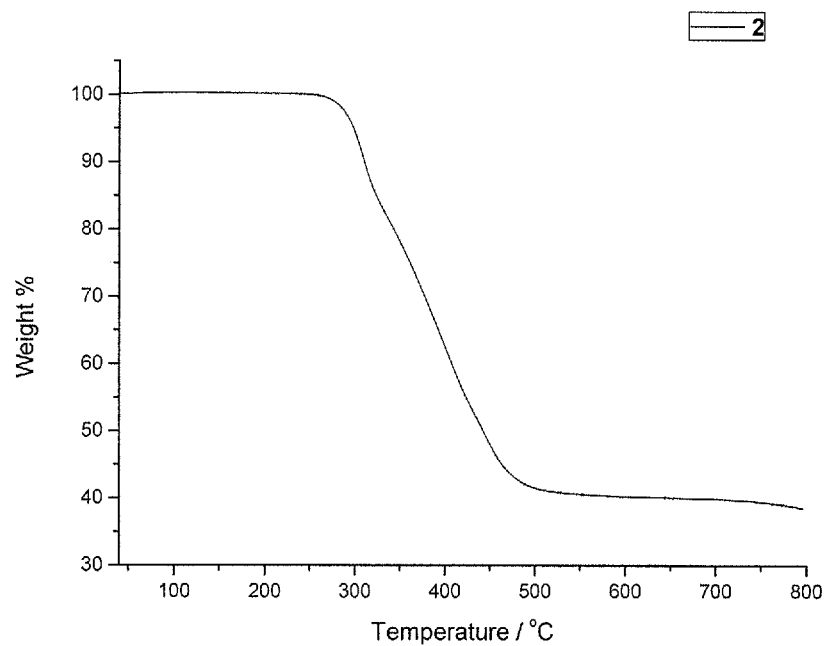
FIG. 7 depicts a TGA thermogram of Emitter 102.
Figure 8:
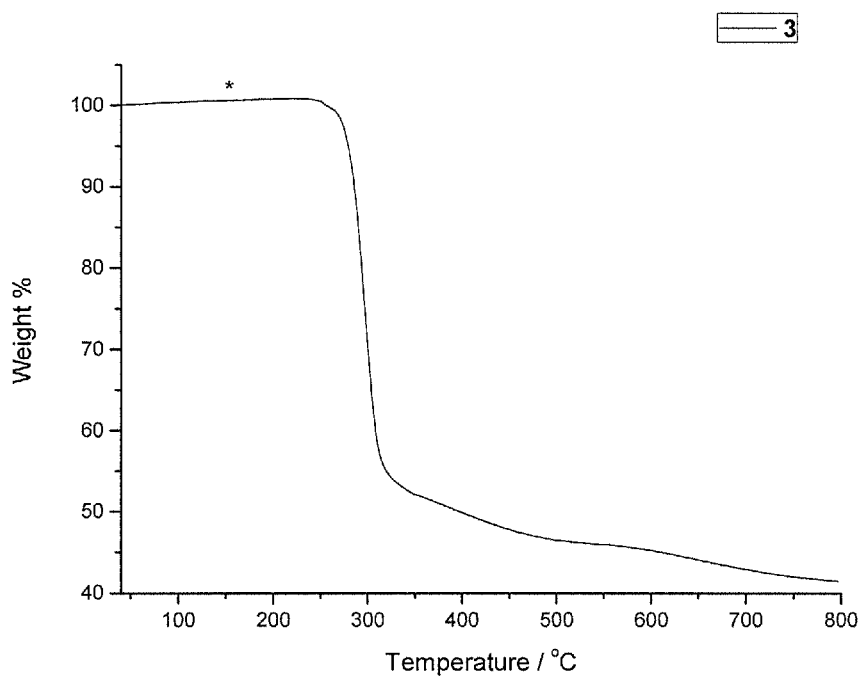
FIG. 8 depicts a TGA thermogram of Emitter 103.
Figure 9:
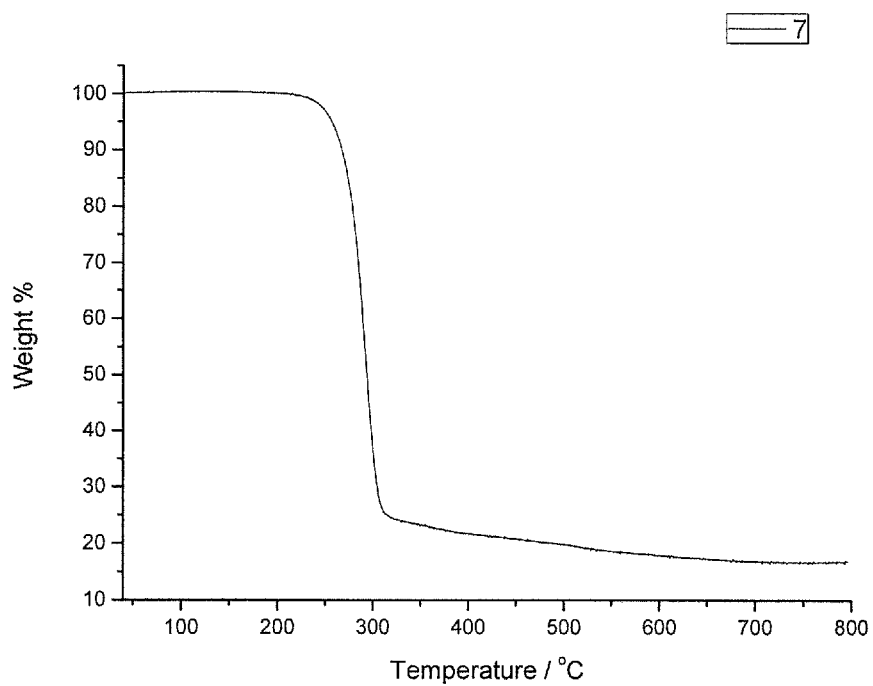
FIG. 9 depicts a TGA thermogram of Emitter 107.

The TGA thermograms are depicted in FIGS. 7-9.

Example 619—Photophysical Data of Emitters 101 and 102

| Emitter | UV/Vis absorption[a] $\lambda_{abs}$ [nm] (ε [mol$^{-1}$dm$^3$cm$^{-1}$]) | Medium[a],[b] | Emission $\lambda_{max}$ [nm] (τ [μs]) | $k_{nr}$ | Quantum efficiency |
|---|---|---|---|---|---|
| 101 | 274 (10700), 285 (13200), 306 (18000), 311 (17900), 350 (br, 800) | $CH_2Cl_2$ | 466, 500, 534 (51) | 1.49 × 10$^4$ | 0.24 |
|  |  | Glass 77K | 461, 496, 525 (123.9) |  |  |
| 102 | 266 (9800), 273 (9800), 282 (10000), 294 (8900), 313 (7000), 350 (br, 1400) | $CH_2Cl_2$ | 467, 501, 533 (53) | 1.36 × 10$^4$ | 0.28 |
|  |  | Glass 77K | 461, 496, 525 (121.6) |  |  |
|  |  | PMMA (5%) | 467, 502, 535 |  | 0.35 |

[a]Measurements performed at 298K unless specified.
[b]EtOH:MeOH = 4:1 solution were used for glass measurements at 77K.
[c]Solution emission quantum yield measured using [Ru(bpy)$_3$][PF$_6$]$_2$ in degassed acetonitrile as the standard (Φ = 0.062)

Figure 10:
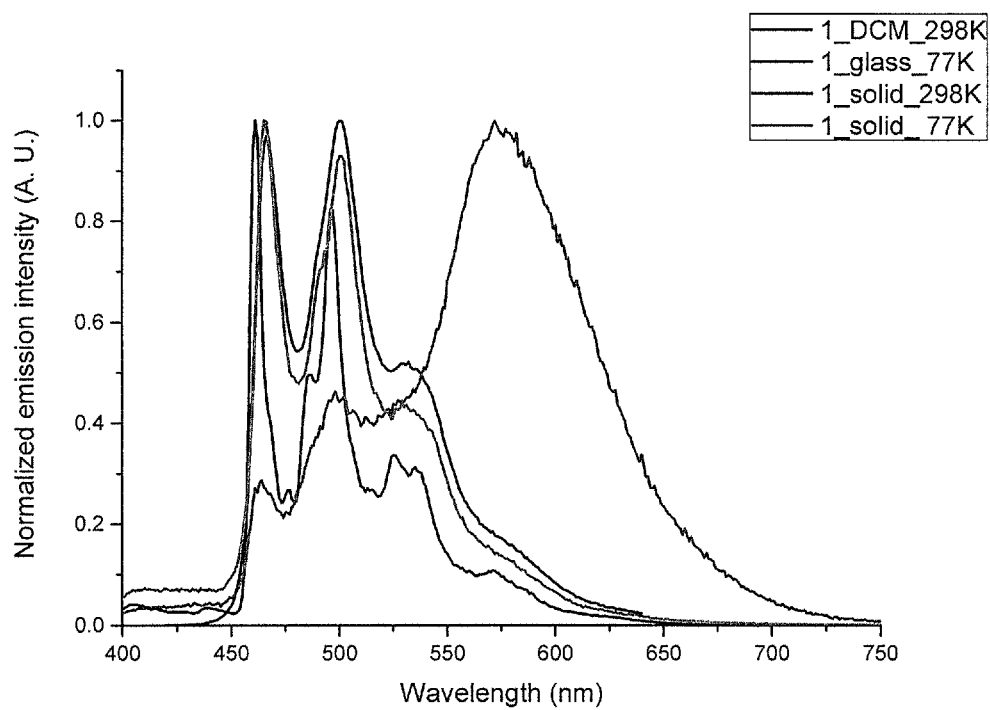
FIG. 10 depicts the Emission spectra of Emitter 101 in degassed $CH_2Cl_2$ (conc.: $2\times10^{-5}$ M), 77 K glass (EtOH:MeOH=4:1) and solid at 298 K and 77 K respectively.
Figure 11:
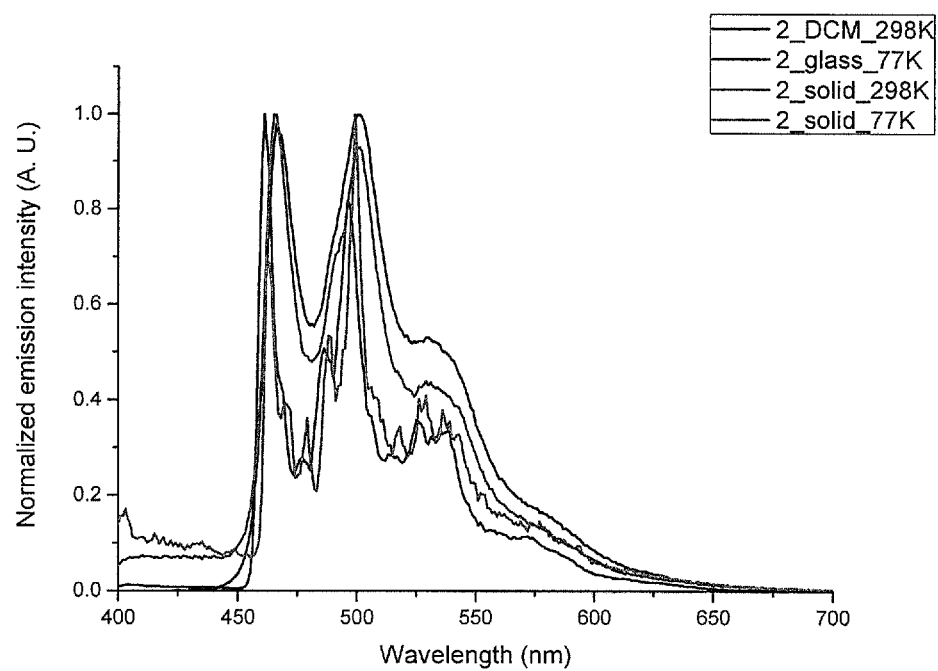
FIG. 11 depicts the Emission spectra of Emitter 102 in degassed $CH_2Cl_2$ (conc.: $2\times10^{-5}$ M), 77 K glass (EtOH:MeOH=4:1) and solid at 298 K and 77 K respectively.

The emission spectra are depicted in FIGS. 10 and 11.

Example 620—OLED Fabrication of Emitter 102

In order to investigate the electroluminescent (EL) properties of Emitter 102, organic light-emitting devices (OLEDs) fabricated by both vacuum deposition (VDOLEDs) and solution process (SPOLEDs) techniques have been studied. Considering the high triplet energy ($E_t$~2.7 eV) of 102, the host and charge transporting materials with higher $E_t$ than 2.7 eV is necessary to effectively confine the triplet excitons in the emitting layer (ETL) and block the back energy transfer to the host and/or charge transporting material(s). The ineffective confinement of triplet excitons and the back energy transfer would severely lower the device efficiency. With this device design strategy, 9-(4-tertbutylphenyl)-3,6-bis(triphenylsilyl)-9H-carbazole (CzSi, $E_t$=3.02 eV), and diphenylphosphine oxide-4-(triphenylsilyl)phenyl (TSPO1, $E_t$=3.36 eV) have been used as the host and electron-transporting/hole-blocking layer (ETL/HBL), respectively, in the VDOLED. The device structure of the VDOLEDs was ITO/MoO$_3$ (2 nm)/TAPC (40 nm)/TCTA (10 nm)/CzSi (3 nm)/CzSi: 102 (20 nm)/TSPO1 (10 nm)/TPBi (40 nm)/LiF (1.2 nm)/Al (150 nm). Besides CzSi and TSPO1 mentioned above, di-[4-(N,N-ditolyl-amino)-phenyl]cyclohexane (TAPC) was used as hole-transporting layer (HTL), 4,4',4''-tris(carbazole-9-yl)triphenylamine (TCTA) as hole-transporting/electron-blocking layer (HTL/EBL), 2,2',2''-(1,3,5-benzinetriyl)-tris(1-phenyl-1-H-benzimidazole) (TPBi) as ETL. Similarly, high-$E_t$ materials 2,6-dicarbazolo-1,5-pyridine (PYD2, $E_t$=2.93 eV) and bis{2-[di(phenyl)phosphino]-phenyl}ether oxide (DEPEO, 3.00 eV) have been respectively used as host and ETL/HBL in SPOLED with 102 as the emitting dopant. The device architecture of SPOLEDs was ITO/PEDOT:PSS/PYD2:102 (40 nm)/DEPEO (5 nm)/TPBi (40 nm)/LIF (1.2 nm)/Al (Al). The doping concentration of 102 was 4 wt % or 10 wt % in both VDOLEDs or SPOLEDs.

Example 620—Key Performance Parameters of OLEDs with Emitter 102

| Device type | $V_{on}$[c] (V) | Max. CE (cd A$^{-1}$) | Max. PE (lm W$^{-1}$) | Max. EQE (%) | CIE[d] (x, y) |
|---|---|---|---|---|---|
| VD[a]-4 wt % | 4.1 | 6.57 | 5.16 | 2.12 | (0.33, 0.54) |
| VD[a]-10 wt % | 3.8 | 18.98 | 14.91 | 6.05 | (0.32, 0.54) |

| Device type | $V_{on}{}^c$ (V) | Max. CE (cd A$^{-1}$) | Max. PE (lm W$^{-1}$) | Max. EQE (%) | CIE$^d$ (x, y) |
|---|---|---|---|---|---|
| SP$^b$-4 wt % | 6.3 | 1.61 | 0.69 | 0.55 | (0.29, 0.50) |
| SP$^b$-10 wt % | 7.1 | 9.07 | 3.71 | 3.12 | (0.28, 0.50) |

$^a$OLED fabricated by vacuum deposition.
$^b$OLED fabricated by solution process.
$^c$Turn-on voltage (luminance = 1 cd m$^{-2}$).
$^d$CIE coordinates at 100 cd m$^{-2}$.

Figure 12:
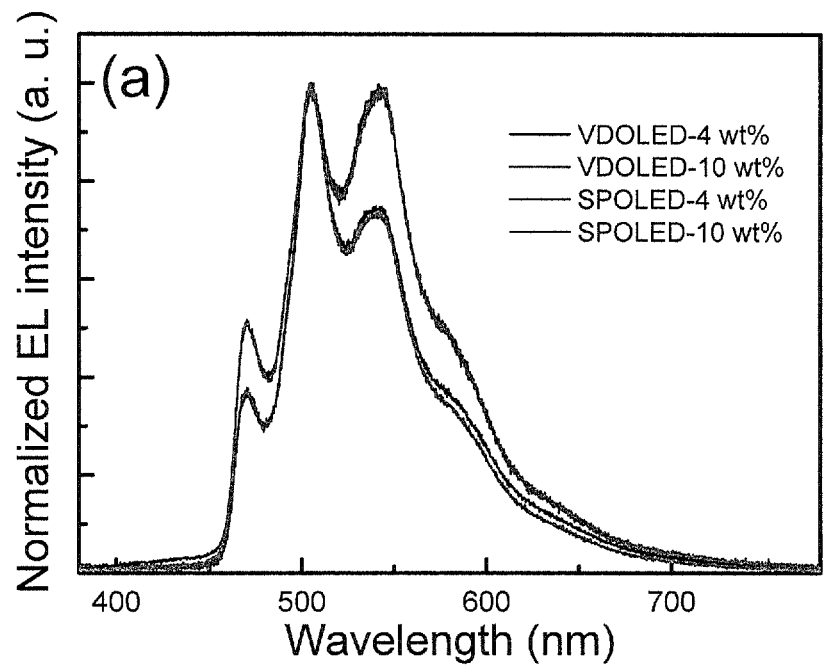
FIG. 12 depicts the EL spectra of VDOLEDs and SPOLEDs fabricated by Emitter 102.
Figure 13:
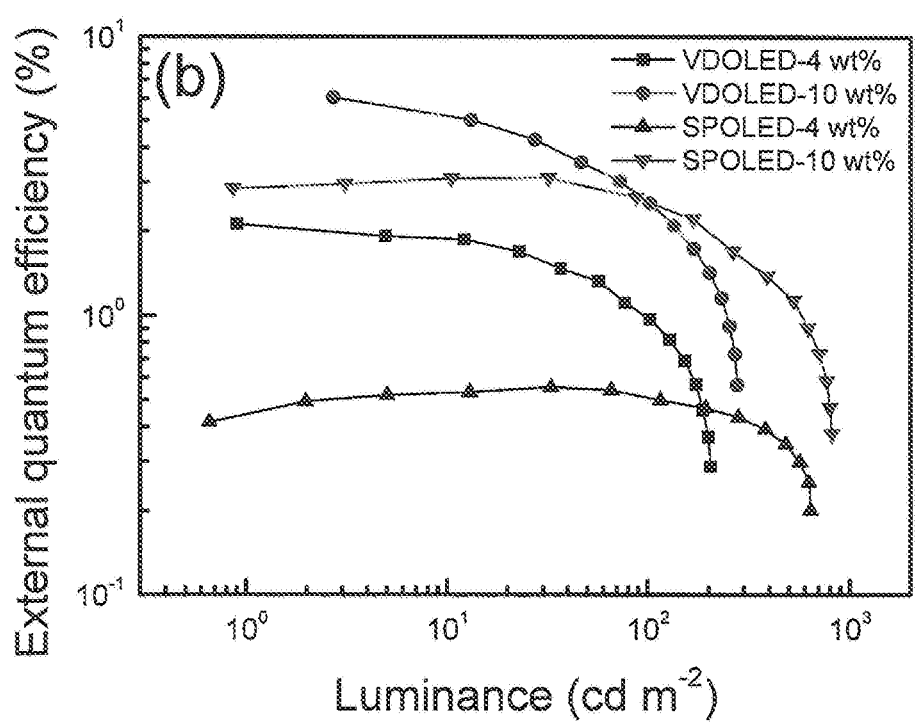
FIG. 13 depicts the EQE-luminance characteristics of VDOLEDs and SPOLEDs fabricated by Emitter 102.

The EL spectra and EQE-luminance characteristics of VDOLEDs and SPOLEDs are depicted in FIGS. 12 and 13.

With respect to any figure or numerical range for a given characteristic, a figure or a parameter from one range may be combined with another figure or a parameter from a different range for the same characteristic to generate a numerical range.

Other than in the operating examples, or where otherwise indicated, all numbers, values and/or expressions referring to quantities of ingredients, reaction conditions, etc., used in the specification and claims are to be understood as modified in all instances by the term "about."

While the invention has been explained in relation to certain embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. A gold(III)-based compound having one of the following structures

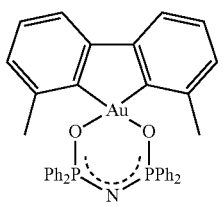

Structure 115

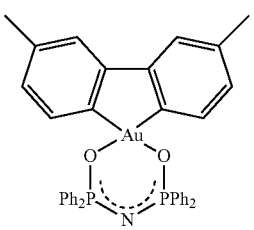

Structure 116

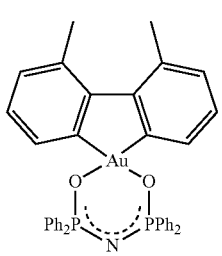

Structure 117

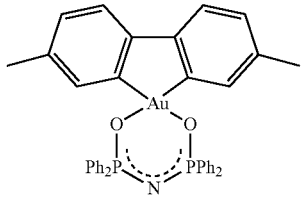

Structure 118

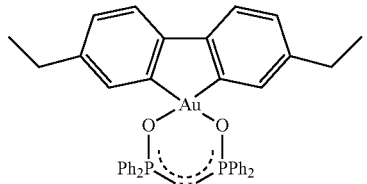

Structure 119

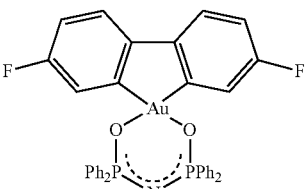

Structure 120

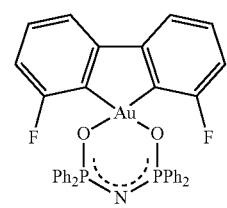

Structure 121

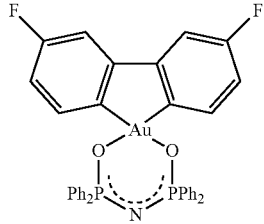

Structure 122

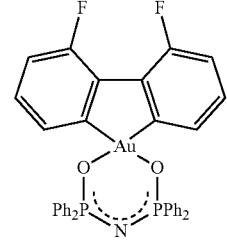

Structure 123

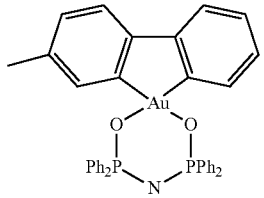

Structure 124

-continued

Structure 125
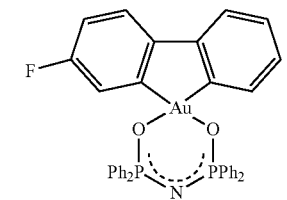

Structure 126
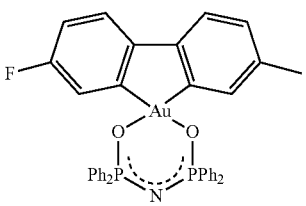

Structure 127
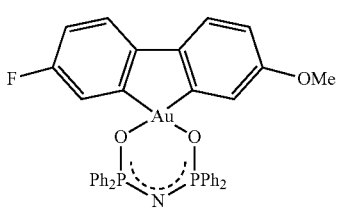

Structure 128
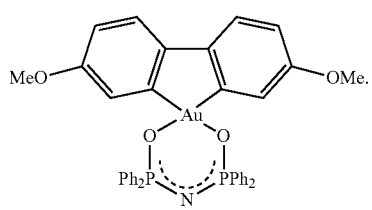

2. A light-emitting device comprising at least one OLED emitter comprising a gold(III)-based compound having a structure that is recited in claim 1 as the emitting material(s).

3. The device of claim 2, wherein the device consists of one emissive layer.

4. The device of claim 2, wherein the device consists of more than one emissive layer.

5. An OLED emitter comprising a gold(III)-based compound, wherein the gold(III)-based compound has one of the following structures:

Structure 115
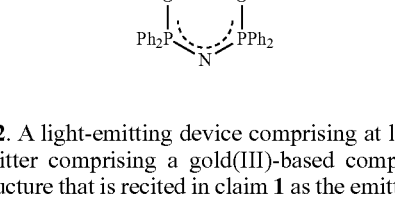

Structure 116
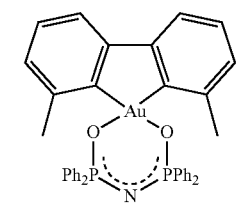

-continued

Structure 117
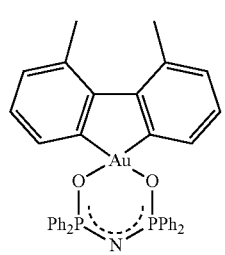

Structure 118
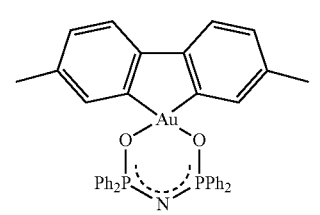

Structure 119
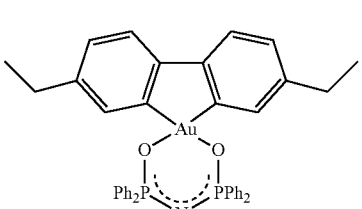

Structure 120
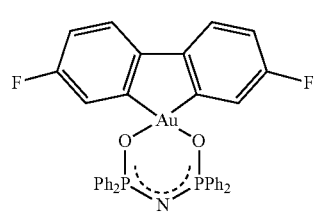

Structure 121
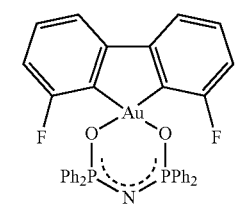

Structure 122
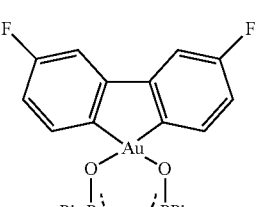

Structure 123
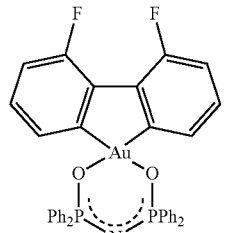

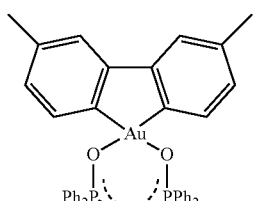

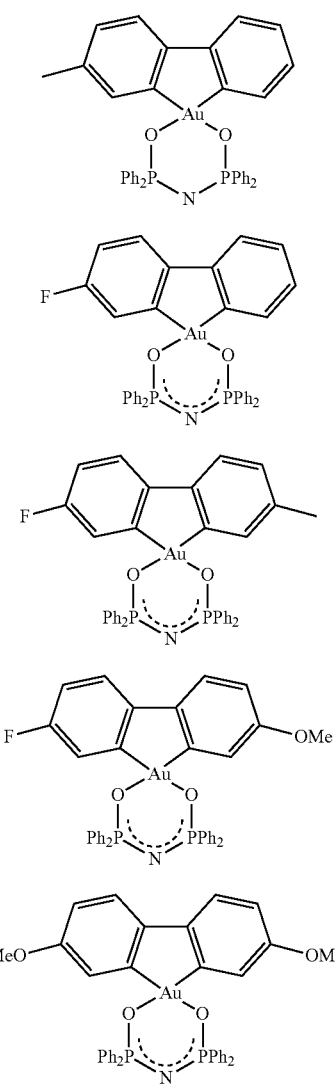
Structure 124
Structure 125
Structure 126
Structure 127
Structure 128
6. The OLED emitter of claim 5, wherein the gold(III)-based compound has one of the following structures:
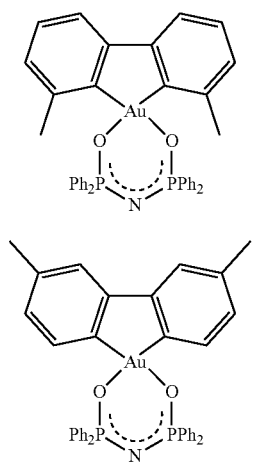
Structure 115
Structure 116
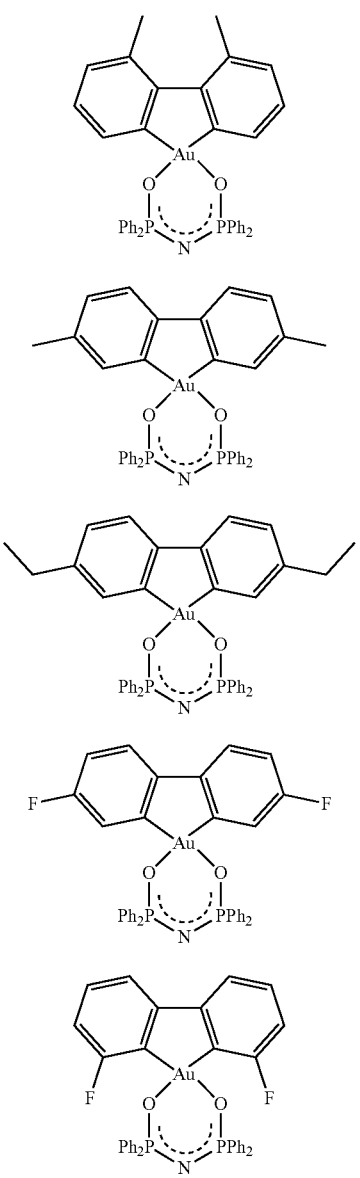
Structure 117
Structure 118
Structure 119
Structure 120
Structure 121
Structure 122
Structure 123

Structure 124

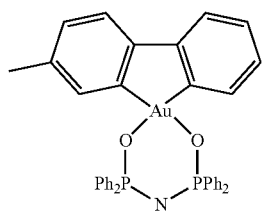

Structure 125

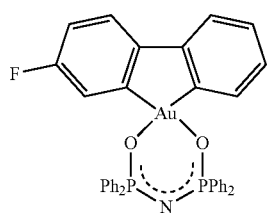

Structure 126

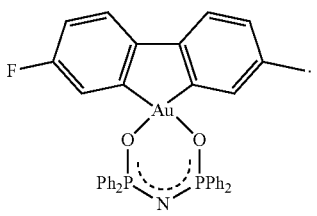

7. A method of making the gold(III)-based compound of claim 1, comprising:
reacting a halo-substituted biphenyl compound with n-butyl lithium and then adding $SnBu_2Cl_2$ to provide a dialkyl-biphenyl tin intermediate;
reacting the dialkyl-biphenyl tin intermediate Intermediate with gold chloride hydrate to provide a multiphenyl dichloro bi-gold complex intermediate; and
reacting the multiphenyl dichloro bi-gold complex intermediate with a deprotonated emission turn-on unit to provide the gold(III)-based compound of claim 1.

* * * * *